(12) United States Patent
Li

(10) Patent No.: US 8,618,971 B1
(45) Date of Patent: Dec. 31, 2013

(54) SIGNAL LEVEL SHIFT CIRCUIT AND METHOD FOR DUAL RESISTOR LADDER DIGITAL-TO-ANALOG CONVERTERS

(75) Inventor: Qunying Li, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/566,224

(22) Filed: Aug. 3, 2012

(51) Int. Cl.
*H03M 1/66* (2006.01)

(52) U.S. Cl.
USPC .......................................... 341/145; 341/144

(58) Field of Classification Search
USPC ......................................... 341/144, 145, 155
See application file for complete search history.

(56) References Cited

U.S. PATENT DOCUMENTS

| 5,808,576 A | 9/1998 | Chloupek et al. | |
|---|---|---|---|
| 7,372,387 B2 * | 5/2008 | Li et al. | 341/145 |
| 7,501,970 B2 * | 3/2009 | Trifonov et al. | 341/145 |
| 7,592,940 B2 * | 9/2009 | Sung | 341/145 |
| 7,595,746 B2 * | 9/2009 | Iorga et al. | 341/145 |
| 7,928,881 B1 * | 4/2011 | Baek et al. | 341/145 |

* cited by examiner

*Primary Examiner* — Brian Young
(74) *Attorney, Agent, or Firm* — Alan A. R. Cooper; W. James Brady, III; Frederick J. Telecky, Jr.

(57) ABSTRACT

A dual resistor ladder DAC includes a coarse ladder including a plurality of coarse ladder resistors and a fine ladder including a plurality of MOS transistors coupled between first and second conductors. A first group of parallel-connected bit-shifting transistors is coupled between the first and third conductors. A second group of parallel-connected MOS bit-shifting transistors is coupled between the third and top conductors. A third group of parallel-connected bit-shifting transistors is coupled between bottom and fourth conductors. A fourth group of parallel-connected bit-shifting transistors is coupled between the second and fourth conductors. Parallel-connected bit-shifting transistors are turned either on or off in response to a plurality of bit-switching bits of a binary number to be converted. One of the bottom, first, second, third, and top conductors is coupled to a DAC output conductor in response to the plurality of bit-switching bits.

20 Claims, 14 Drawing Sheets

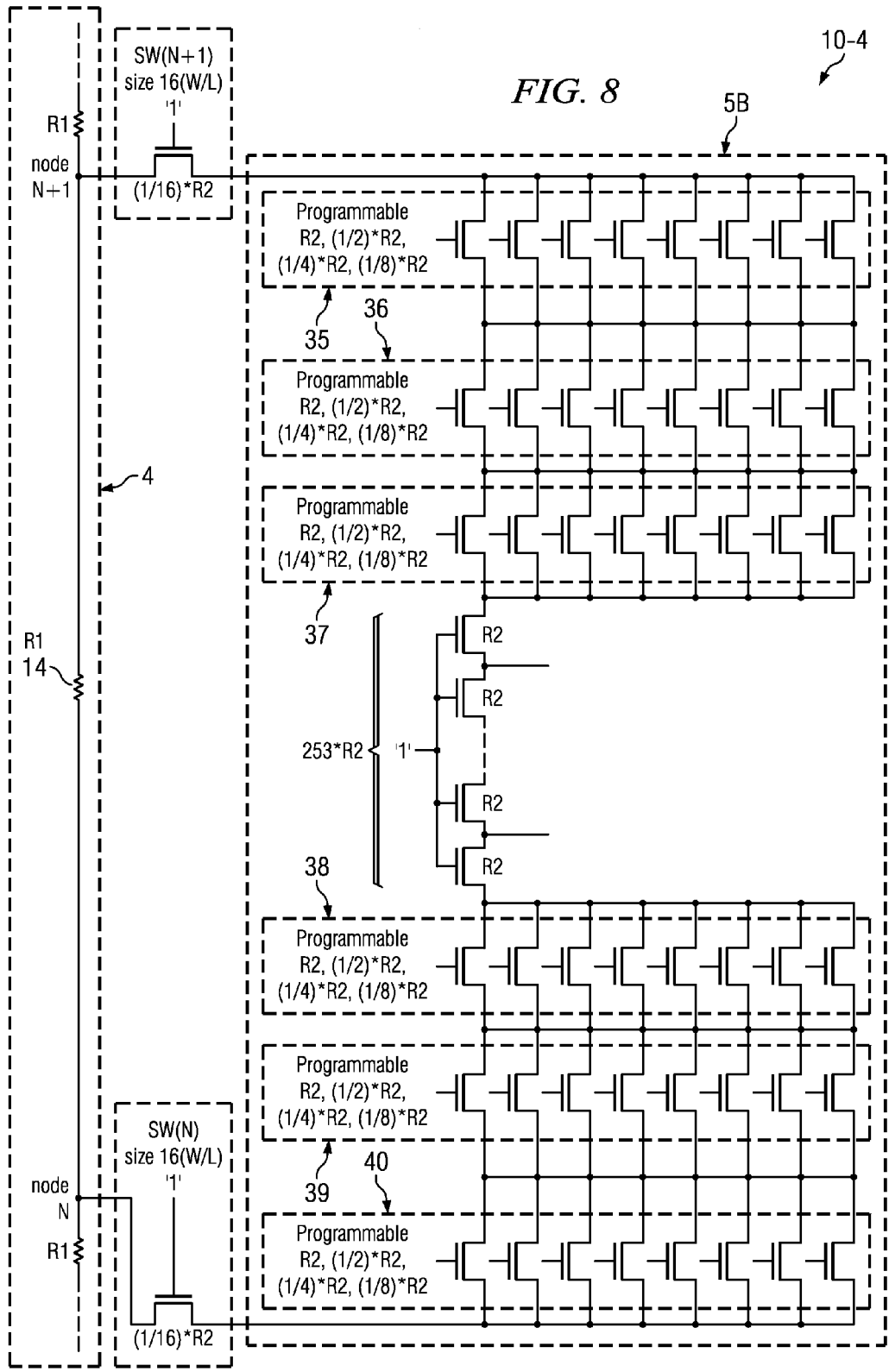

SIGNAL LEVEL SHIFT CIRCUIT AND METHOD FOR DUAL RESISTOR LADDER DIGITAL-TO-ANALOG CONVERTERS

BACKGROUND OF THE INVENTION

The present invention relates generally to increasing the resolution of a digital-to-analog converter (DAC) having a predetermined number of bits, and more particularly, to signal level shift shifting circuitry and corresponding methodology in a dual resistor ladder DAC.

Important considerations in designing a DAC usually include determining and obtaining both a required amount of resolution, which relates to differential nonlinearity (DNL), and required amount of accuracy, which relates to integral nonlinearity (INL). Other important considerations include the required operating speed, component count, integrated circuit chip area, current consumption, and power dissipation of the DAC. An appropriate DAC architecture may be chosen from various options depending on application requirements and specifications. A dual resistor ladder architecture is usually chosen for some applications, for example in a voice coil motor position control loop of a hard disk drive servo integrated circuit. Monotonicity is a basic requirement for the DAC of a control loop, and is inherently provided by a dual resistor ladder DAC (because the resistors used in the resistor ladders never have negative resistance).

In a dual resistor ladder DAC, the known technique of increasing DAC resolution by 1 bit usually requires doubling the number of resistors in either a coarse ladder or a fine ladder of the dual resistor ladder DAC. Doubling the number of resistors doubles the impedance and also the parasitic capacitance of the ladders in the DAC, and consequently degrades its operating speed and increases its silicon area cost. See U.S. Pat. No. 5,808,576 entitled "Resistor String Digital-to-Analog Converter", issued Sep. 15, 1998 to James Chloupek, Henry Tin-Hang Yung and Steven Wiyi Yang. This reference discloses a basic bit-shifting technique to increase resolution in a resistor string DAC having a fixed number of string resistors.

Also see commonly assigned U.S. Pat. No. 7,372,387 entitled "Digital-to-Analog Converter with Triode Region Transistors in Resistor/Switch Network", issued May 13, 2008 to Qunying Li and Juergen Luebbe, and entirely incorporated herein by reference. This reference discloses use of series-connected MOSFETs operating in their deep triode regions as resistive elements in the fine ladder section of a dual resistor ladder.

FIG. 1 illustrates the architecture of a dual resistor ladder DAC 10-1 including a 6 bit coarse ladder 4 and an 8 bit fine ladder 5. Coarse ladder 4 includes 64 poly (polycrystalline silicon) resistors of resistance R1 connected in series between Vref+ on conductor 2-64 and Vref-on conductor 2-0. The various nodes between the 64 resistors R1 are connected to conductors 2-1, 2-2, ..., 2-N, ..., 2-63, respectively, wherein the node number N may be any integer between 0 and 63. The left terminal of each of switches SW(0), SW(1), ..., SW(N), ..., SW (63), and SW(64) is connected to a corresponding conductor 2-0, 2-1, 2-2, ..., 2-N, ..., 2-63, and 2-64, respectively, where N may be any integer between 0 and 64. The right terminal of each of switches SW(0), SW(1), ..., SW(N-1), SW(N), SW(N+1), ..., SW (63), and SW(64) is connected to a corresponding conductor 3-0, 3-1, ..., 3-(N-1), 3-N, 3-(N+1), 3-63, and 3-64, respectively.

Fine ladder 5 includes 255 poly resistors of resistance R2 connected in series between the right terminal of one of switches SW(0), SW(1), ..., SW(64) having its left terminal connected to the upper node of a selected resistor 14 of the 64 resistors R1 in coarse ladder 4 and the right terminal of another of switches SW(0), SW(1), ..., SW(64) having its left terminal connected to the lower node of selected resistor 14 in coarse ladder 4. (Of course, selected resistor 14 may be any of the 64 resistors R1.) In the example shown in FIG. 1, fine ladder 5 is illustrated as being connected between conductors 3-N and 3-(N+1), where N may be any integer between 0 and 63. The various nodes between the 255 resistors R2 are connected to conductors 7-1, 7-2, ..., 07-253, and 7-254, respectively. The left terminal of each of switches S(0), S(1), ..., S(254), and S(255) is connected to a corresponding conductor 3-N, 7-1, 7-2, 7-254, and 3-(N+1), respectively, where N may be any integer between 0 and 255. The right terminal of each of switches S(0), S(1), ..., S(254), and S(255) is connected to DAC output conductor 3.

The switches connected to coarse ladder 4 are actuated by corresponding output conductors 17 of a 6 bit MSB digital decoder 6, and the switches S(0), S(1), ..., S(254), and S(255) connected to of fine ladder 5 are actuated by corresponding output conductors 18 of an 8 bit LSB digital decoder 8. A 14 bit digital bus 12 supplies the 6 MSBs DIN<13:8> of a digital input code DIN<13:0> to MSB decoder 6, and also supplies the 8 LSBs DIN<7:0> of a digital input code DIN<13:0> to LSB decoder 6.

When fine ladder 5 is shunted between nodes N and N+1 with a selected R1 resistor 14, and the various switches are implemented by means of MOS transistors, the "ON" channel resistance $R_{DS(ON)}$ of each of switches SW(N) and SW(N+1) is considered as half of one "minimum step unit resistance" in fine ladder 5. The ON channel resistance $R_{DS(ON)}$ of each of switches SW(N) and SW(N+1) is equal to $(\frac{1}{2})*R2$.

Thus, switches SW(0), SW(1) ... SW(64) (which usually are MOS transistor switches) are used to selectively connect any 2 adjacent nodes of the group 2-0, 2-1 ... 2-64 in coarse ladder 4 with the upper and lower end terminals, respectively, of fine ladder 5. During circuit operation, fine ladder 5 is switched so as to be shunted with the one of the "R1" resistors of coarse ladder 4 that is presently selected by MSB decoder 6. In the present example, R1 resistor 14 between node N and node (N+1) is selected, i.e., connected in parallel with fine ladder 5, by closing the two switches SW(N) and SW(N+1) associated with R1 resistor 14 while opening all of the other switches connected to coarse ladder 4. Therefore, the voltage drop across the chosen coarse ladder resistor 14 is applied across the series connection of the "R2" resistors of fine ladder 5.

One of the many node signal levels within fine ladder 5 is selected in response to 8 bit LSB decoder 8 and passed to DAC output conductor 3 by closing the one of switches S(0), S(1), ..., and S(255) associated with the selected node while opening all of the others.

Prior Art FIG. 2A indicates a way to improve or optimize the trade-off between resolution and speed performance of DAC 10-1 of Prior Art FIG. 1 without having to resort to the previously mentioned doubling or quadrupling, etc., of the number of poly resistors and without the associated doubling or quadrupling, etc., of the impedance and capacitance of DAC 10-1. Dual resistor ladder DAC 10-2 of Prior Art FIG. 2A includes all of the circuitry of DAC 10-1 of Prior Art FIG. 1, and fine ladder 5 further includes one additional poly "R2 resistor" 21 of resistance R2 connected between conductor 3-(N+1) and one terminal of a switch 25 which has its other terminal connected to conductor 7-254. Another additional poly R2 resistor 22 of resistance R2 is connected between conductor 7-1 and one terminal of a switch 24 which has its other terminal connected to conductor 3-N. DAC 10-2 of FIG.

2A also includes an additional 1-bit "shift bit" decoder 15 which has 2 output conductors 19. One of the 2 conductors 19 is connected so as to control switch 25 and the other conductor 19 is connected so as to control switch 24.

Digital bus 12-1 is a 15-bit bus which supplies the 6 MSBs DIN<14:9> of a 15 bit digital input code DIN<14:0> to MSB decoder 6, supplies the 6 LSBs DIN<8:1> of digital input code DIN<14:0> to LSB decoder 8, and supplies a single shift bit b<0> to shift bit decoder 15.

The basic technique used in DAC 10-2 of FIG. 2A is to shunt or couple an equal R2 resistance 21 in parallel with the top R2 resistor 20 and another R2 resistance 22 in parallel with the bottom R2 resistor 23 of fine ladder 5 in a "complementary manner" such that a 0.5 LSB step of the original 14 bit DAC is created. The 14 bit DAC 10-2 in FIG. 2A provides "0.5 bit level shifting" which in effect extends the 14 bit DAC of FIG. 1 to a 15 bit DAC without doubling the number of resistors in either coarse ladder 4 or fine ladder 5 and without doubling the output impedance and output capacitance of DAC 10-2.

Note that dual resistor ladder DAC 10-2 is a resistive circuit, and if its resolution is to be extended by 1 bit by doubling the number of its fine ladder resistors, the DAC output impedance is nearly doubled, and similarly for the DC parasitic output capacitance. That causes the RC time constant at the DAC output 3 to be much longer, resulting in slower DAC operation. In contrast, if the foregoing level shift method is used and the DAC resolution is extended by 1 bit, then the number of resistors in the fine ladder is not doubled, so the DAC operating speed is not slowed down. That is a substantial benefit of the level shift method of extending resolution of a dual resistor ladder DAC.

However, the bit level shifting circuitry in FIG. 2A has drawbacks. A major drawback is that the on-state switch resistance $R_{DS(ON)}$ of switches 24 and 25 has an impact on the DNL and INL performance of DAC 10-2. In DAC 10-2 of FIG. 2A, the switch ON resistance $R_{DS(ON)}$ between ladders (i.e. at the two input terminals 3-N and 3-(N+1) of fine ladder 5) is considered to provide a "minimum unit step" resolution of fine ladder 5. This requires the ON resistance of each MOS transistor switch to be equal to one fourth of the fine ladder unit resistance R2, that is, equal to:

$$R_{DS(ON)} = \frac{1}{k'\frac{W}{L}(V_G - V_S - V_T)} = \frac{R2}{4}, \quad \text{Equation (1)}$$

where W/L is the channel-width-to-channel-length ratio of the MOS transistor switch, $V_G$ is the gate voltage of the MOS transistor switch, $V_S$ is source voltage of the MOS transistor switch, $V_T$ is its gate-to source turn-on threshold voltage, and k' is a proportionality constant.

The channel resistance $R_{DS(ON)}$ of the switches SW(N) and SW(N+1) for connecting coarse ladder 4 to fine ladder 5, and the channel resistance of the switches 24 and 25 performing the above-mentioned bit level shifting, can not be adequately matched with the polycrystalline silicon R2 resistors in fine ladder 5. This is partly because N-channel transistors and poly resistors are implemented in different steps during wafer fabrication, and partly because they also have substantially different temperature coefficients. The inadequate matching results in substantial degradation of DNL and INL performance of prior art DAC 10-2.

Compared to DAC 10-1 in FIG. 1, the minimum step in fine ladder 5 in FIG. 2A Is represented by R2/2. Therefore, $R_{DS(ON)}$ of MOS transistor switches SW(N) and SW(N+1) is equal to 4×R2. It is difficult for the on-state channel resistance $R_{DS(ON)}$ of a MOS transistor switch to perfectly match the resistance of a polycrystalline silicon resistor with resistance R2, not only because the MOS switches and poly resistors are formed in different steps of the wafer fabrication process and have different temperature coefficients, but also because the channel resistances $R_{DS(ON)}$ are dependent on the source voltages Vs of the various MOS transistor switches SW(0), SW(1), ..., SW(64) connected to the various nodes of the coarse ladder and therefore vary substantially.

The switch channel resistance $R_{DS(ON)}$ between ladders may be adjusted (by some amount) to provide some degree of matching with the resistance R2 by using switch size scaling, i.e., "W/L" scaling, based on Equation (1) and a known value of transistor source electrode voltage Vs. Unfortunately, such W/L scaling does not provide adequate matching. However, the switches 24 and 25 that perform the bit level shifting in fine ladder 5 usually are "exercised" in same way for every code generated by 8 LSB digital encoder 8. To minimize the effect of mismatching of switch resistance $R_{DS(ON)}$ and TC (temperature coefficient) effects on the DNL of DAC 10-2, the various switches must be designed with a very large W/L ratio. Unfortunately, a large switch occupies more integrated circuit chip area and causes greater charge injection. This may result in large voltage glitches in the DAC circuit and longer settling times during circuit operation.

Those skilled in the art understand that when an N-type MOS transistor switch is turned on, its channel region is inverted and electrons in the channel are expelled from the channel region when the MOS switch is suddenly turned off. The expelled electrons constitute "charge injection", which generate the voltage glitches at the DAC output conductor 3. Therefore, large size MOS switch transistors are required to achieve good DNL in DAC 10-2 of FIG. 2A, but unfortunately this causes higher amounts of charge injection and consequently larger voltage glitches at the DAC output 3.

With reference now to FIG. 2B, there is shown a diagram of a high-level view of a dual-resistor ladder DAC 600, as shown in FIG. 6*a* of the above-mentioned commonly assigned '387 patent. The diagram shown in FIG. 2B illustrates the dual-resistor ladder DAC 600, wherein the dual-resistor ladder DAC 600 features transistors, preferably N-type MOS transistors, operating in a triode region and used as resistors in the fine resistor ladder portion of the dual-resistor ladder DAC 600. As discussed previously, the use of transistors rather than poly resistors can help to eliminate a source for impedance mismatch and therefore improve the DNL of the dual-resistor ladder DAC 600.

The dual-resistor ladder DAC 600 in FIG. 2B includes a coarse resistor ladder 605 comprised of N coarse resistor/switch banks, such as coarse resistor/switch bank 607. The number of coarse resistor/switch banks is dependent upon a number of binary digits decoded by a first decoder 610 in the coarse resistor ladder 605 and the number of binary digits decoded by a second decoder 611. For example, in a 12 bit dual-resistor ladder DAC, wherein six bits are decoded by the coarse resistor ladder 605 and six bits are decoded by a fine resistor ladder, with a resistor/switch bank of 16 resistors and 16 switches, four coarse resistor/switch banks may be needed. The first decoder 610 is used to select one out of the N coarse resistor/switch banks. Referring to the example discussed above, a 2-to-4 decoder is used to decode two of the six binary digits decoded by the coarse resistor ladder 605 to select one of the four coarse resistor/switch banks.

Every switch in the N coarse resistor/switch banks is coupled to one of two buses, shown in FIG. 2B as buses 615.

The use of the bus 615 and associated two-level decoding circuitry can reduce the hardware and circuitry requirements of the decoder 610 used in the coarse resistor ladder and a first decoder 630 used in a fine resistor ladder. For example, in a coarse resistor ladder that uses one-level decoding, an associated decoder needs to select a single resistor, resulting in a decoder with a complexity that is on the order of $2^6=64$, while using two-level decoding, the complexity of the decoder is on the order of $2^3+2^32^3=16$. A bank of switches, such as switch bank 620, one for each bus, couples the output of the switches in the N coarse resistor/switch banks to either a top terminal or a bottom terminal of the fine resistor ladder 625.

The fine resistor ladder 625 comprises M fine resistor/switch banks, such as fine resistor/switch bank 627. The number of fine resistor/switch banks in the fine resistor ladder 625 is dependent upon the number of binary digits decoded by the first decoder 630 of the fine resistor ladder 625 as well as the number of binary digits decoded by a second decoder 631. With reference back to the example discussed previously, if six bits are decoded by the fine resistor ladder 625 and each fine resistor/switch bank contains eight resistors and switches (one of the fine resistor/switch banks will contain one fewer resistor than the remaining M−1 fine resistor/switch banks), then eight fine resistor/switch banks are needed. The first decoder 630 can be used to select one of the M fine resistor/switch banks. Using the example discussed previously, the first decoder 630 is a 3-to-8 decoder. The first decoder 630 decodes three of the six binary digits provided to the fine resistor ladder 625 to select one of the eight fine resistor/switch banks. Again, the use of two-stage decoding and the fine resistor/switch banks in the fine resistor ladder 625 result in a reduction in the complexity of the digital circuitry compared to one-stage decoding. Each switch in the M fine resistor/switch banks is coupled to a bus 635 that allows the coupling of the switches to a fine-ladder switch bank 640. The fine ladder switch bank 640 permits the coupling of outputs of the switches in the M fine resistor/switch banks to an output of the dual-resistor ladder DAC 600. Using the example discussed previously, the second decoder 631 decodes the remaining three binary digits to select one of the eight outputs from the fine ladder switch bank 640 and provides it to the output of the dual-resistor ladder DAC 600.

Prior Art FIG. 2C is a copy of FIG. 7a of the above-mentioned commonly assigned '387 patent, in which series-connected MOS transistors, including transistors 716, 717, and 718 operated in their triode regions are utilized as the resistors in fine ladder 715, analogously to the series-connected resistors R2 in Prior Art FIG. 2A, and bit level shifting MOS transistor 720 is analogous to bit level shifting resistor 22 and its associated switch 24 in FIG. 2A, and bit level shifting MOS transistor 721 is analogous to bit level shifting resistor 21 and its associated switch 25 in FIG. 2A. The '387 patent teaches that the dual-resistor ladder of DAC 700 is not affected by changing the resistance of a top resistor and a bottom resistor and its fine resistor ladder 715 and there are no mismatches due to differences in temperature coefficients and voltage coefficients. The '387 patent notes that the "half resistance" of the top resistor cell including MOS resistors 718 and 721 and the half resistance of the bottom resistor cell including MOS resistors 717 and 720 closely match the resistance in the fine resistor ladder 715 over process and temperature variations and can greatly improve DNL performance.

A drawback of DAC 700 in FIG. 2C is that it only provides 1-bit level shifting. If a designer wishes to extend the DAC resolution by 1 bit resolution based on DAC 700, the number of resistors in either the coarse ladder or the fine ladder must be doubled, resulting in the previously mentioned substantially slower DAC operation.

It would be highly desirable to have a circuit and method to perform improved 2 bit level shifting (and higher bit level shifting) in a dual resistor ladder DAC to solve above mentioned problems.

Thus, there is an unmet need for a dual resistor ladder DAC and method which provide substantially improved signal level bit-shifting circuitry and operation so as to achieve substantially improved resolution and accuracy of the DAC.

There also is an unmet need for a dual resistor ladder DAC and method which provide substantially improved signal level bit-shifting circuitry and operation so as to achieve substantially improved resolution and accuracy of the DAC without increasing the output impedance and output capacitance of the DAC.

There also is an unmet need for a dual resistor ladder DAC and method which provide substantially improved signal level bit-shifting circuitry and operation so as to achieve substantially improved resolution and accuracy of the dual resistor ladder DAC by improving the matching of resistive elements within the DAC over a range of fabrication processes and temperatures.

SUMMARY OF THE INVENTION

It is an object of the invention to provide a dual resistor ladder DAC and method which provide substantially improved signal level bit-shifting circuitry and operation so as to achieve substantially improved resolution and accuracy of the DAC.

It is another object of the invention to provide a dual resistor ladder DAC and method which provide substantially improved signal level bit-shifting circuitry and operation so as to achieve substantially improved resolution and accuracy of the DAC without increasing the number of resistors in either a coarse ladder or a fine ladder of the DAC, and hence without increasing its output impedance and output capacitance.

It is another object of the invention to provide a dual resistor ladder DAC and method which provide substantially improved signal level bit-shifting circuitry and operation so as to achieve substantially improved resolution and accuracy of the dual resistor ladder DAC by improving the matching of resistive elements within the DAC over a range of fabrication processes and temperatures.

Briefly described, and in accordance with one embodiment, the present invention provides a dual resistor ladder DAC (10-3) includes a coarse ladder (4) including a plurality of coarse ladder resistors and a fine ladder (5A) including a plurality of MOS transistors (33-1, 2 . . . 254) coupled between first (X+255 LSB) and second (X+1 LSB) conductors. A first group of parallel-connected MOS bit-shifting transistors (29) is coupled between the first and third (X+255+(½) LSB) conductors. A second group of parallel-connected MOS bit-shifting transistors (28) is coupled between the third and top (FL_TOP) conductors. A third group of parallel-connected MOS bit-shifting transistors (31) is coupled between bottom (FL_BOT) and fourth (X+(½) LSB) conductors. A fourth group of parallel-connected MOS bit-shifting transistors (30) is coupled between the second and fourth conductors. Parallel-connected MOS bit-shifting transistors are turned either on or off in response to a plurality of bit-switching bits of a binary number to be converted. One of the bottom, first, second, third, and top conductors is coupled to a DAC output conductor (3) in response to the plurality of bit-switching bits.

In one embodiment, the invention provides digital-to-analog converter (DAC) (10-3) which includes a coarse ladder (4) including a first linear sequence of series-connected coarse ladder resistive devices (R1), and a plurality of coarse ladder nodes (nodes 0, 1 ... 63, 65) coupled between various series-connected coarse ladder resistive devices, respectively, and which also includes a fine ladder (5A) including a second linear sequence of series-connected MOS (metal oxide semiconductor) fine ladder transistors (33-1, 2 ... 254) coupled between a first conductor (X+255 LSB) and a second conductor (X+1 LSB). The fine ladder transistors are biased to operate in their deep triode regions. The fine ladder also includes a first group of parallel-connected MOS programmable bit-shifting transistors (29) each coupled between the first conductor (X+255 LSB) and a third conductor (X+255+(½) LSB), and a second group of parallel-connected MOS programmable bit-shifting transistors (28) each coupled between the third conductor (X+255+(½) LSB) and a top conductor (FL_TOP). The fine ladder also includes a third group of parallel-connected MOS programmable bit-shifting transistors (31) each coupled between a bottom conductor (FL_BOT) and a fourth conductor (X+(½) LSB), and a fourth group of parallel-connected MOS programmable bit-shifting transistors (30) each coupled between the second conductor (S+1 LSB) and the fourth conductor (X+(½) LSB). The programmable bit-shifting transistors are either turned either on or off, respectively, in response to a plurality of bit-switching bits (DIN<1:0>) of a binary number. The DAC also includes bit-shifting resistor switching circuitry including a plurality of bit-shifting switching transistors (e.g., S(0), S(A), S(1) ... S(255), S(B), S(C)) configured to couple a predetermined one of the bottom conductor (FL_BOT), the fourth conductor (X+(½) LSB), the third conductor (X+255+(½) LSB) and the top conductor (FL_TOP) to the DAC output conductor (3) in response to the plurality of bit-switching bits (DIN<1:0>) to provide increased resolution of the DAC (10-3).

In a described embodiment, the DAC includes coarse ladder switching circuitry including a plurality of coarse ladder switching transistors (SW(0), SW(1), ..., SW(64)) configured to selectively couple the top conductor (FL_TOP) to one terminal of a selected coarse ladder resistive device (14) and to selectively couple the bottom conductor (FL_BOT) to another terminal of the selected coarse ladder resistive device (14) in response to a plurality of MSB (most significant bit) bits (DIN<15:10>) of the binary number. The DAC also includes fine ladder switching circuitry including a plurality of fine ladder switching transistors (S(0), S(1) ... S(255)) configured to selectively couple a predetermined node (FL_BOT, X+1 LSB, X+2 LSB, ... or X+255 LSB) of the second linear sequence of series-connected MOS fine ladder transistors (33-1, 2 ... 254) to a DAC output conductor (3) in response to a plurality of LSB (least significant bit) bits (DIN<9:2>) of the binary number.

In one embodiment, the binary number to be converted includes 6 MSBs (most significant bits), 8 LSBs (least significant bits), and at least 2 least significant bit-shifting bits. In one embodiment, the fine ladder transistors (33-1, 2 ... 254), the programmable bit-shifting transistors of the first (29), second (28), third (31), and fourth (30) groups, the coarse ladder switching transistors (SW(0), SW(1), ..., SW(64)), the fine ladder switching transistors (S(0)), S(1) ... S(255)), and the bit-shifting switching transistors (S(A), S(B), S(C)) are N-channel transistors.

In one embodiment, the fine ladder transistors (33-1, 2 ... 254), the bit-shifting transistors of the first (29), second (28), third (31), and fourth (30) groups, the fine ladder switching transistors (S(0), S(1) ... S(255)), and the bit-shifting switching transistors (S(A), S(B), S(C)) each have a channel-width-to-channel-length ratio equal to W/L, and the coarse ladder switching transistors (SW(0), SW(1) ... SW(N−1), SW(N), SW(N+1), SW(N+2) ... SW(63), SW(64)) each have a channel-width-to-channel-length ratio equal to a predetermined multiple of W/L so as to achieve an on-state resistance of each switch that is equal to half of the resistance of a minimum unit resistance in the fine ladder (5A). The coarse ladder switching transistors (SW(0), SW(1), ..., SW(64)) each have a channel-width-to-channel-length ratio equal to $2^{K+1} \times (W/L)$. The first (29), second (28), third (31), and fourth (30) groups each include four of the parallel-connected MOS programmable bit-shifting transistors. In another embodiment, the first (29), second (28), third (31), and fourth (30) groups each include eight of the parallel-connected MOS programmable bit-shifting transistors.

In a described embodiment, the DAC includes an MSB decoder (6) for decoding the plurality of MSB bits of the binary number to be converted to control the plurality of coarse ladder switching transistors (SW(0), SW(1), ..., SW(64)) and a LSB decoder (8) for decoding the plurality of LSB bits of the binary number to be converted to control the plurality of fine ladder switching transistors (SW(0), SW(1) ... SW(63), SW(64)). The DAC also includes a bit-shifting decoder (15A) for decoding the plurality of bit-shifting bits of the binary number to be converted to control the plurality of bit-switching transistors (S(A), S(B), S(C)). In a described embodiment, the bit-shifting decoder (15A) includes both first circuitry (FIGS. 9C-F) for decoding the bit-shifting bits to control gates of the bit-switching transistors (S(A), S(B), S(C)) and second circuitry (FIGS. 9A,B) for decoding the bit-shifting bits to control gates of the programmable bit-shifting transistors of the first (29), second (28), third (31), and fourth (30) groups.

In a described embodiment, drains of odd-numbered coarse ladder switching transistors SW(0), SW(1) ... SW(N−1), SW(N), SW(N+1), SW(N+2) ... SW(63), SW(64) are coupled to the bottom conductor (FL_BOT) and drains of even coarse ladder switching transistors are coupled to the top conductor (FL_TOP).

In a described embodiment, the binary number to be converted includes 6 MSBs (most significant bits), 8 LSBs (least significant bits), and 3 least significant bit-shifting bits. The DAC includes a fifth group of parallel-connected MOS bit-shifting transistors (36) coupled between the third conductor (X+255+(½) LSB) and a fifth conductor (X+255+(¾) LSB), the first group (28) being coupled between the top conductor (FL_TOP) and the fifth conductor (X+255+(¾) LSB), and also including a sixth group of parallel-connected MOS bit-shifting transistors (39) coupled between the fourth conductor (X+(½) LSB) and a sixth conductor (X+(¾) LSB), the fourth group (30) being coupled between the second conductor (S+1 LSB) and the sixth conductor (X+(¾) LSB), wherein each of the first (28), second (29) third (31) fourth (30), fifth (36) and sixth (39) groups includes at least eight parallel-connected MOS bit-shifting transistors.

In one embodiment, the invention provides a method for increasing the resolution of a dual resistor ladder digital-to-analog converter (DAC) (10-3) including a coarse ladder (4) including a first linear sequence of series-connected coarse ladder resistive devices (R1) and a plurality of coarse ladder nodes (nodes 0, 1 ... 63, 64) connected between various series-connected coarse ladder resistive devices, respectively, and also including a fine ladder (5A) including a second linear sequence of series-connected MOS (metal oxide semiconductor) fine ladder transistors (33-1, 2 . . . 254) coupled between a first conductor (X+255 LSB) and a second conductor (X+1 LSB), the method including coupling a first group of parallel-connected MOS programmable bit-shifting transistors (29) between the first conductor (X+255 LSB) and a third conductor (X+255+(½) LSB), and coupling a second group of parallel-connected MOS programmable bit-shifting transistors (28) between the third conductor (X+255+(½) LSB) and a top conductor (FL_TOP); coupling each of a third group of parallel-connected MOS programmable bit-shifting transistors (31) between a bottom conductor (FL_BOT) and a fourth conductor (X+(½) LSB), and coupling a fourth group of parallel-connected MOS programmable bit-shifting transistors (30) between the second conductor (S+1 LSB) and the fourth conductor (X+(½) LSB); turning various parallel-connected MOS programmable bit-shifting transistors either on or off in response to a plurality of bit-switching bits of a binary number to be converted, to provide a plurality of bits of increased resolution; and coupling one of the bottom conductor (FL_BOT), first conductor (X+255 LSB), second conductor (X+1 LSB), third conductor (X+255+(½) LSB), and top conductor (FL_TOP) to a DAC output conductor (3) in response to the plurality of bit-switching bits, to produce an analog output signal having accuracy representative of the increased resolution.

In one embodiment, the method includes selectively coupling the top conductor (FL_TOP) to one terminal of a selected coarse ladder resistive device (14) and selectively coupling the bottom conductor (FL_BOT) to another terminal of the selected coarse ladder resistive device (14) in response to a plurality of MSB (most significant bit) bits of the binary number to be converted; and coupling either a predetermined conductor (FL_BOT, X+1 LSB, X+2 LSB, . . . or (X+255 LSB) of the second linear sequence of series-connected MOS fine ladder transistors (33-1, 2 . . . 254) to the DAC output conductor (3) in response to a plurality of LSB (least significant bit) bits of the binary number to be converted or a predetermined one of the fourth conductor (X+(½) LSB), the third conductor (X+255+(½) LSB) and the top conductor (FL_TOP) to the DAC output conductor (3) in response to the plurality of bit-switching bits.

In one embodiment, the method includes selectively coupling the top conductor (FL_TOP) to one terminal of a selected coarse ladder resistive device (14) and selectively coupling the bottom conductor (FL_BOT) to another terminal of the selected coarse ladder resistive device (14) in response to a plurality of MSB (most significant bit) bits (DIN<15:10>) of the binary number, the method also including selectively coupling a predetermined node (FL_BOT, X+1 LSB, X+2 LSB, . . . or X+255 LSB) of the second linear sequence of series-connected MOS fine ladder transistors (33-1, 2 . . . 254) to the DAC output conductor (3) in response to a plurality of LSB (least significant bit) bits (DIN<9:2>) of the binary number.

In one embodiment, the method includes decoding the plurality of MSB bits of the binary number to be converted to control a plurality of coarse ladder switching transistors (SW (0), SW(1), . . . , SW(64)) to selectively couple the selected coarse ladder resistive device (14) to the top conductor (FL_TOP) and the bottom conductor (FL_BOT), decoding the plurality of LSB bits of the binary number to be converted to control a plurality of fine ladder switching transistors (SW(0), SW(1) . . . SW(63), SW(64)) to selectively couple a selected fine ladder node (X+1, 2, . . . , 255 LSB) to the DAC output conductor (3) and, decoding the plurality of bit-shifting bits of the binary number to be converted to control a plurality of bit-switching transistors (S(A), S(B), S(C)) to selectively couple the first (X+255 LSB), second (X+1 LSB), third (X+255+(½) LSB), and fourth (X+(½) LSB) conductors to the DAC output conductor (3).

In one embodiment the method includes decoding the bit-shifting bits to control gates o the f bit-switching transistors (S(A), S(B), S(C)) by means of first decoding circuitry (FIGS. 9C-F), the method also including decoding the bit-shifting bits to control gates of the programmable bit-shifting transistors of the first (29), second (28), third (31), and fourth (30) groups by means of the second decoding circuitry (FIGS. 9A,B).

In one embodiment, the invention provides a dual resistor ladder digital-to-analog converter (DAC) (10-3) including a coarse ladder (4) including a first linear sequence of series-connected coarse ladder resistive devices (R1) and a plurality of coarse ladder nodes (nodes 0, 1 . . . 63, 64) connected between various series-connected coarse ladder resistive devices, respectively, and a fine ladder (5A) including a second linear sequence of series-connected MOS (metal oxide semiconductor) fine ladder transistors (33-1, 2 . . . 254) coupled between a first conductor (X+255 LSB) and a second conductor (X+1 LSB); means (15A,S(255,B,C)) for coupling a first group of parallel-connected MOS programmable bit-shifting transistors (29) between the first conductor (X+255 LSB) and a third conductor (X+255+(½) LSB), and coupling a second group of parallel-connected MOS programmable bit-shifting transistors (28) between the third conductor (X+255+(½) LSB) and a top conductor (FL_TOP); means (15A,S(0,1,A)) for coupling each of a third group of parallel-connected MOS programmable bit-shifting transistors (31) between a bottom conductor (FL_BOT) and a fourth conductor (X+(½) LSB), and coupling a fourth group of parallel-connected MOS programmable bit-shifting transistors (30) between the second conductor (S+1 LSB) and the fourth conductor (X+(½) LSB); means (15A,49-1,49-2, 49-3) for turning various parallel-connected MOS programmable bit-shifting transistors either on or off in response to a plurality of bit-switching bits of a binary number to be converted, to provide a plurality of bits of increased resolution; and means (15A,49-4,49-5, 49-6,49-7) for coupling one of the bottom conductor (FL_BOT), first conductor (X+255 LSB), second conductor (X+1 LSB), third conductor (X+255+(½) LSB), and top conductor (FL_TOP) to a DAC output conductor (3) in response to the plurality of bit-switching bits, to produce an analog output signal having accuracy representative of the increased resolution.

BRIEF DESCRIPTION OF THE DRAWINGS

FIG. 8 is a diagram of a dual-resistor ladder DAC having three-bit LSB signal level shifting in accordance with the present invention.

DETAILED DESCRIPTION OF THE PREFERRED EMBODIMENTS

A dual resistor ladder DAC includes signal level bit-shifting circuitry and uses a corresponding signal level bit-shifting method to improve DAC resolution and accuracy without increasing the fine ladder output impedance and output capacitance and without decreasing the speed of the DAC. FIGS. 3 to 7 display a 2-bit signal level shifting scheme in the fine ladder of a dual resistor ladder DAC. The signal level bit-shifting circuitry in these drawings greatly improves the accuracy of matching between the channel resistances of various MOS transistor switches that perform fine ladder switching, the resistances of switches that perform signal level bit-shifting operations, and the "unit resistances" of poly resistors in the fine ladder. The improved matching greatly improves the DNL and INL performance of the DAC over a range of wafer fabrication process and temperature variations.

Figure 1:
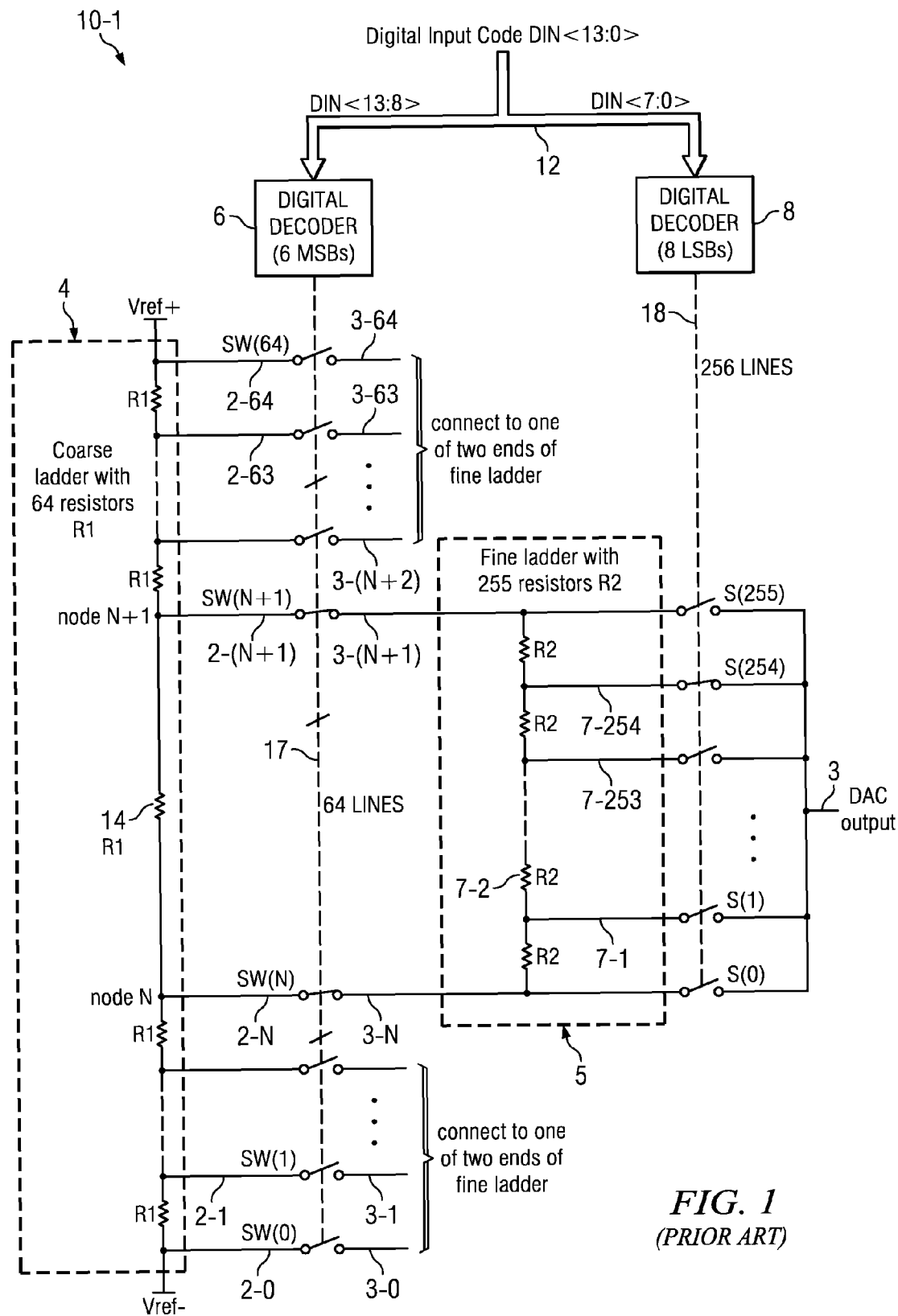
FIG. 1 is a diagram of a conventional dual-resistor ladder DAC.
Figure 2A:
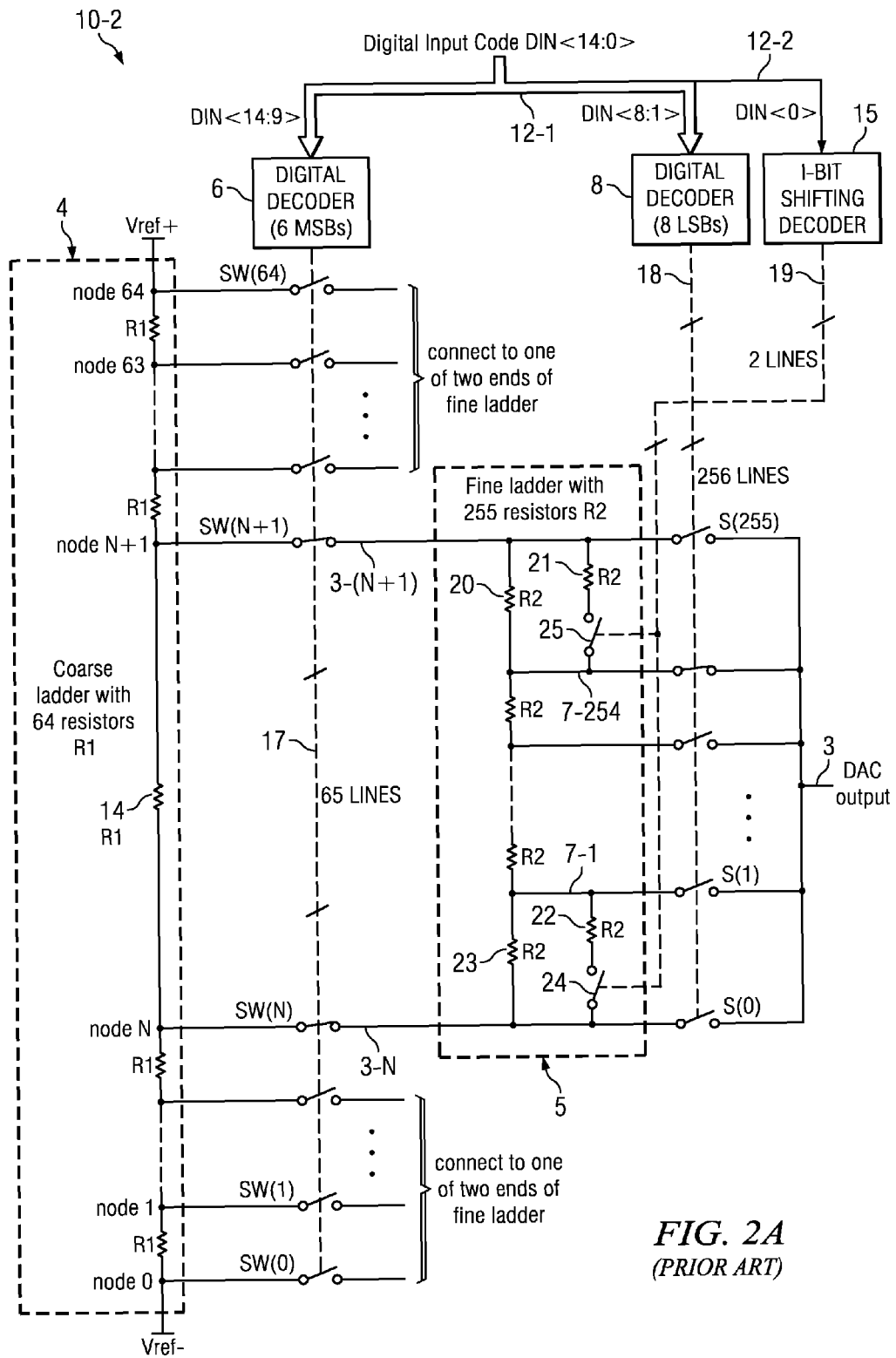
FIG. 2A is a diagram of a conventional dual-resistor ladder DAC having 1-bit signal level shifting.
Figure 2B:
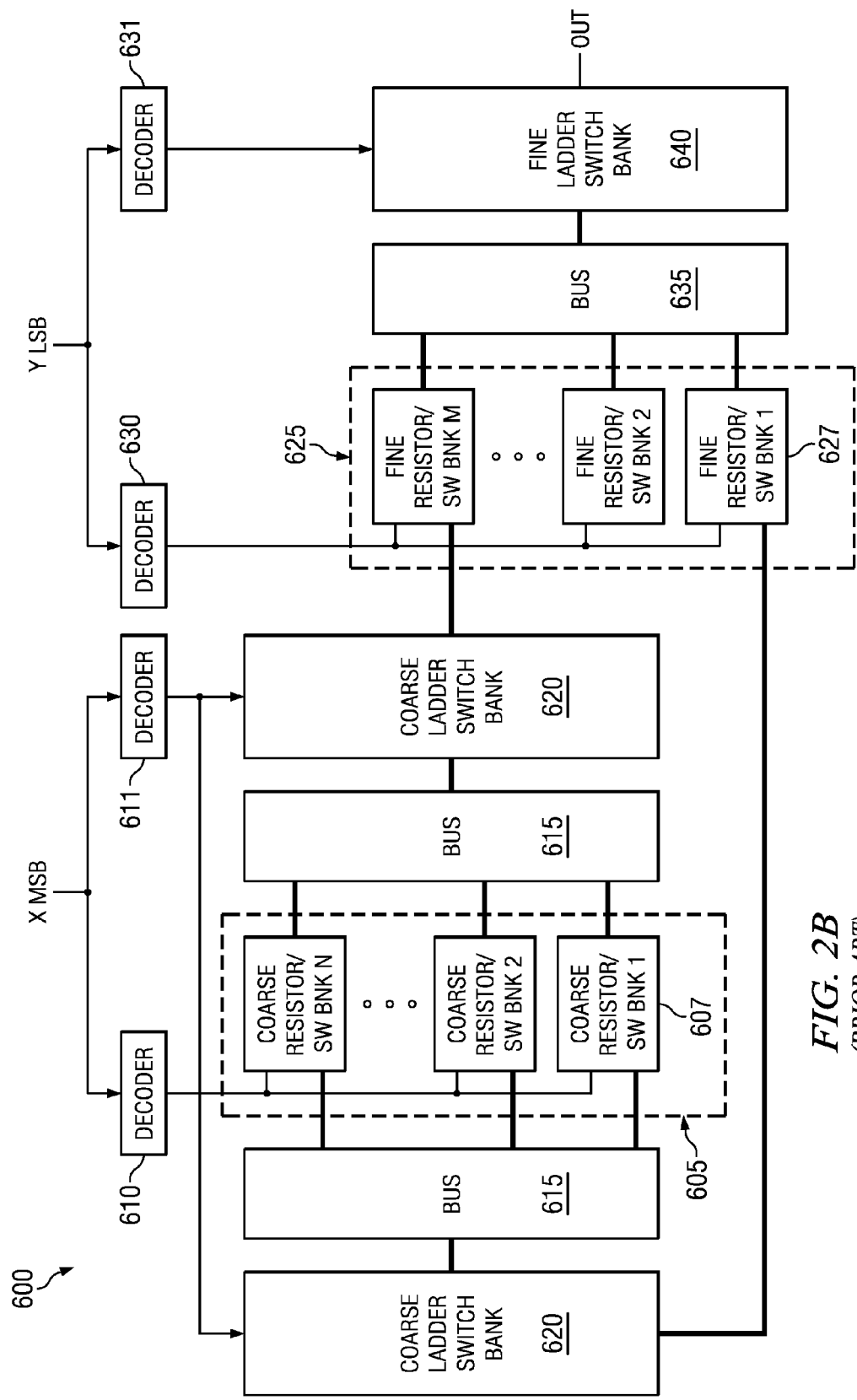
FIG. 2B is a copy of FIG. 6a of Prior Art U.S. Pat. No. 7,372,387
Figure 2C:
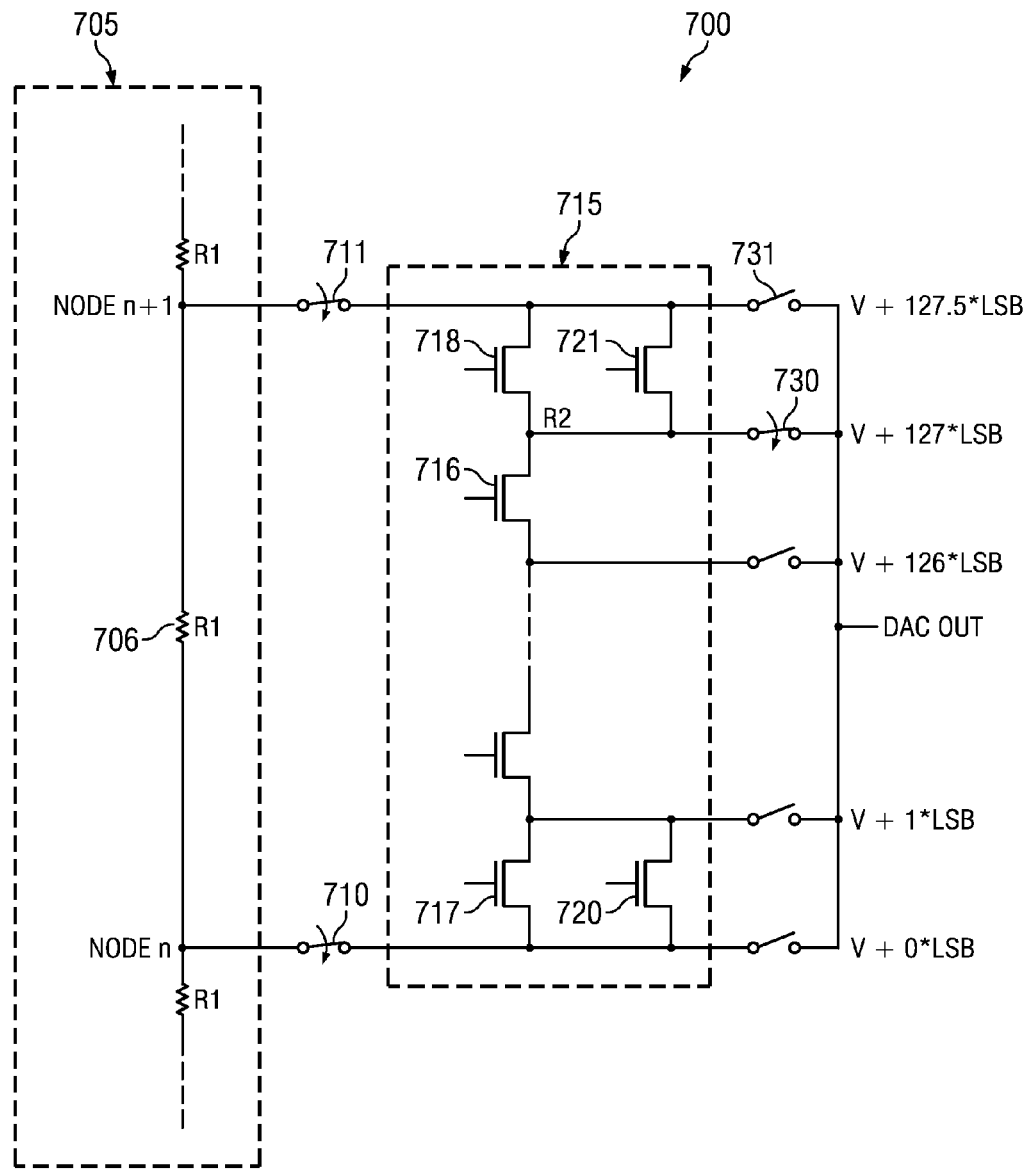
FIG. 2C is a copy of FIG. 7a of Prior Art U.S. Pat. No. 7,372,387.
Figure 3:
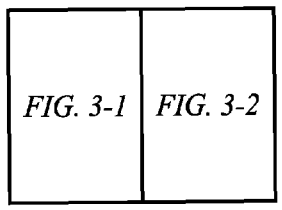
FIG. 3 consists of FIGS. 3-1 and 3-2, and Is a diagram of a dual-resistor ladder DAC having two-bit LSB signal level shifting in accordance with the present invention.
Figures 1, 3:
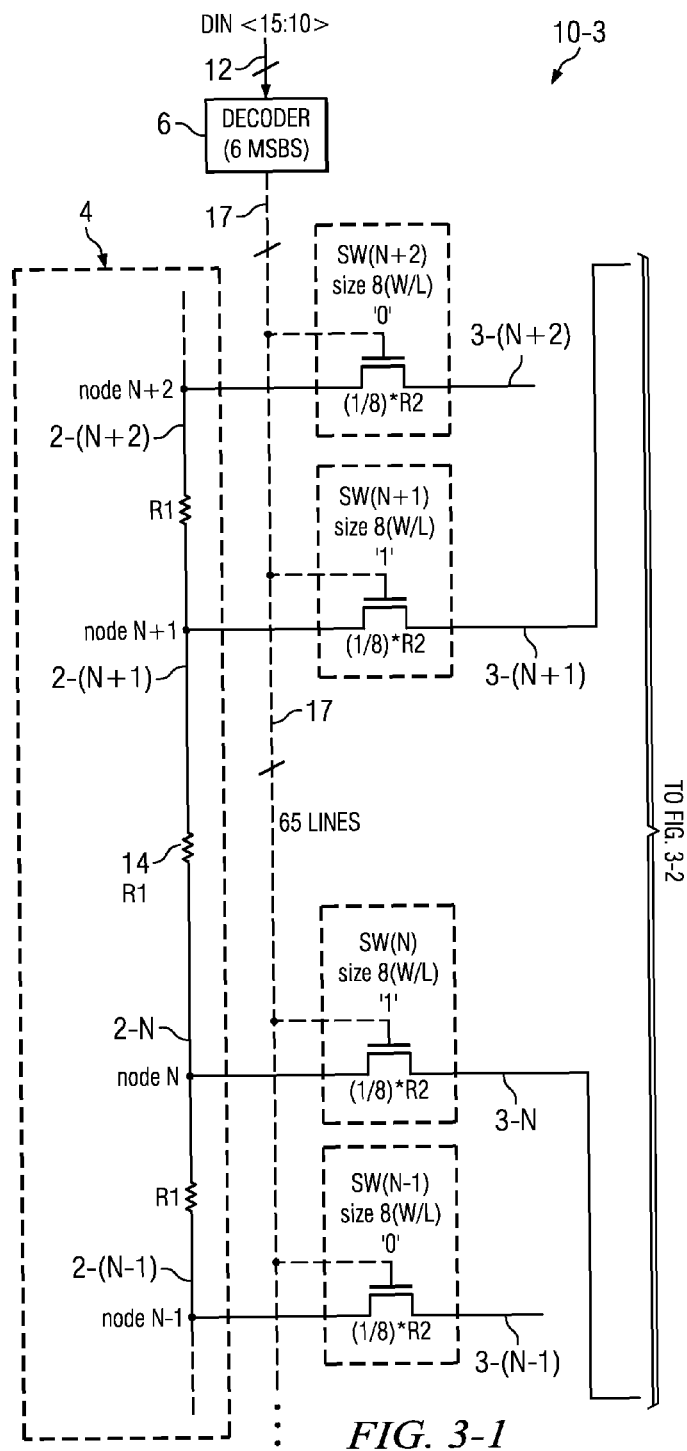
Figures 2, 3:
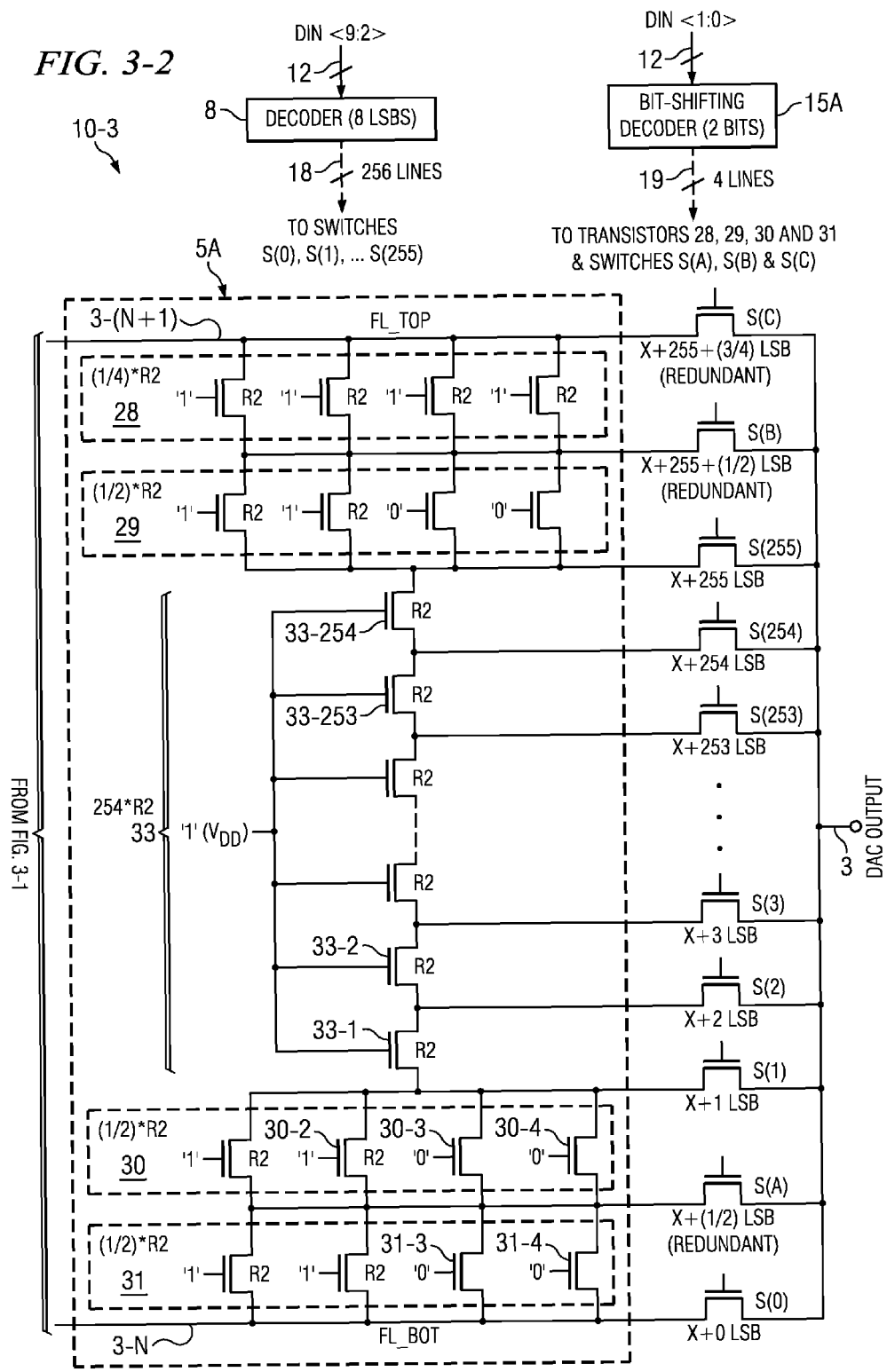

FIG. 3 consists of FIGS. 3-1 and 3-2, and illustrates the architecture of a dual resistor ladder DAC 10-3 which may, for example, include a 6 bit coarse ladder 4 and an 8 bit fine ladder 8 as in Prior Art FIG. 2A. Only a portion of course ladder 4 is shown. Coarse ladder 4 in FIG. 3-1 Includes 64 poly resistors R1 connected in series between Vref+ on conductor 2-64 and Vref− on conductor 2-, as shown in Prior Art FIG. 2A. The various coarse ladder circuit nodes between the 64 resistors R1 are connected to conductors 2-1, 2-2, . . . , 2-N, . . . , 2-63, and 2-64, respectively, where N may be any integer between 1 and 64. The left terminal of each of switches or switch transistors SW(0), SW(1), . . . , SW(N−1), SW(N), SW(N+1), SW(N+2) . . . SW (63), and SW(64), as shown in FIG. 2A, is connected to a corresponding one of conductors 2-0, 2-1, . . . , 2-N, . . . , 2-63, and 2-64, respectively. The right terminal of each of switches or switch transistors SW(0), SW(1) . . . SW(N−1), SW(N), SW(N+1), SW(N+2) . . . SW (63), and SW(64) is connected to a corresponding conductor 3-0, 3-1 . . . 3-(N−1), 3-N, 3-(N+1), 3-(N+2) . . . 3-63, and 3-64, respectively.

A 16 bit digital bus 12 supplies a 16 bit digital input code DIN<15:0> which includes 6-MSB DIN<15:10>, 8-LSB DIN<9:2>, and 2 "shifting bits" DIN<1:0>. The 6 MSBs DIN<15:10> are decoded by MSB decoder 6 to generate 65 decoded conductors or lines 17. The 8 LSBs DIN<9:2> are decoded by LSB decoder 8 to generate 256 decoded conductors 18. The 2 shifting bits DIN<1:0> are decoded by 2-bit-shifting bit decoder 15A to generate 4 decoded conductors 19. The gate electrodes of transistor switches SW(0), SW(1), . . . , SW(N−1), SW(N), SW(N+1), SW(N+2), . . . , SW (63), and SW(64) are connected to the 65 conductors 17, respectively.

Fine ladder 5A in FIG. 3-2 includes 254 N-channel MOS "R2 transistors" 33-1, 33-2, 33-3, . . . , 33-253, 33-254 connected in series. Each of transistors 33-1, 33-2, 33-3, . . . , 33-253, 33-254 has its gate electrode connected to $V_{DD}$, i.e., to a logic "1" level, and therefore is always ON and operating in its deep triode region so it functions as a resistor having a channel resistance equal to R2. Note that the nodes or conductors that are connected to the various source/drain electrodes of the 254 "R2 transistors" are labeled X+0 LSB, X+1 LSB, X+255 LSB to both designate those nodes or conductors individually and also to indicate the analog signal levels associated, respectively, with those various nodes or conductors.

Conductors or nodes X+0 LSB, X+1 LSB, . . . , X+255 LSB are connected to the left terminals of fine ladder switches S(0), S(1), . . . , S(255), respectively. The right terminals of fine ladder switches S(0), S(1), . . . , S(255) all are connected to a DAC output conductor 3.

Four "signal level bit-shifting N-channel MOS transistors" 29 are connected in parallel between the X+255 LSB conductor and another conductor labeled X+255+(½) LSB. Four more such N-channel bit-shifting transistors 28 are connected in parallel between the X+255+(½) LSB conductor and another conductor labeled X+255+(¾) LSB. The X+255+(¾) LSB conductor is also referred to as the "fine ladder top conductor" FL_TOP of fine ladder 5A, and is connected by conductor 3-(N+1) to the right terminal of the SW(N+1) transistor switch. Each of coarse ladder switching transistors SW(0), SW(1), . . . , SW(64) has a channel-width-to-channel-length ratio equal to $*2^{K+1} \times (W/L)$, wherein K is a constant. Therefore, the SW(N+1) transistor has a size equal to 8(W/L), where W/L is a predetermined suitable channel-width-to-channel-length ratio of the various "R2 transistors" in fine ladder 5A of FIG. 3. In FIGS. 3-6, 7-1 and 7-2, the minimum resistance step of fine ladder 5A is (¼)*R2. The resistor units or cells 28, 29, 30, and 31 in fine ladder 5A have resistances of R2, (½)*R2, (¼)*R2, the minimum being (¼)*R2. Switches SW(N) and SW(N+1) should have size of 8(W/L) so that their on-state resistance is (⅛)*R2, which is half of the minimum resistance step (¼)*R2 in fine ladder 5A. When fine ladder 5A is "flipped" from the configuration 10-3A in FIG. 7-1 to the configuration 10-3B in FIG. 7-2, the top conductor or top node FL_TOP actually experiences 2 times the resistance of transistor switch SW(N), that is, 2*(⅛)*R2= (¼)*R2, which is minimum resistance step of fine ladder 5A.

Similarly, four N-channel signal level bit-shifting transistors 30 are connected in parallel between the X+1 LSB conductor and another conductor labeled X+(½) LSB. Also, four more N-channel signal level bit-shifting transistors 31 are connected in parallel between the X+(½) LSB conductor and the X+0 LSB conductor. The X+0 LSB conductor is also referred to as the "fine ladder bottom conductor" FL_BOT of fine ladder 5A, and in the illustrated example, is connected by conductor 3-N to the right terminal of the SW(N) transistor, which has a size equal to 8(W/L).

Conductors X+(½) LSB, X+255+(½) LSB, and X+255+ (¾) LSB are connected to the left terminals of switches S(A), S(B), and S(C), respectively. The right terminals of switches S(A), S(B), and S(C) are connected to DAC output conductor 3. The gate electrodes of transistor switches S(A), S(B), and S(C) are connected to appropriate conductors 19, respectively.

Additional decoding of the bit-shifting bits is provided to control the gates of bit-switching transistors S(A), S(B), S(C) and also to control fine ladder switching transistors S(0), S(1), . . . , S(255). Examples of such decoding are shown in subsequently described FIGS. 9A-9F. Decoder 8 associated with DIN<9:2> is an 8-input-to-256-output decoder and decoder 15A associated with DIN<1:0> is a 2-input-to-4-output decoder. The decoders also include some control logic. It should be understood that one skilled in the art ordinarily would simply specify the required decoding results to a conventional integrated circuit design tool which would automatically generate the required decoding and control circuitry.

The size (i.e., W/L ratio) of each of the SW(0), SW(1), . . . , SW(N+1), SW(N+2) transistors is such that its "ON" channel resistance is equal to (⅛) R2 in the examples of FIGS. 3-7.

The example of FIGS. 3-1 and 3-2 shows 0 LSB shifting operation. The top two cells 28 and 29 and the bottom two cells 30 and 31 in this particular example are programmed in such a way that an integer number I of LSB levels are generated. That is, the gates of all 4 of the transistors in section 28 are at a logic "1" level, the gates of 2 of the transistors in section 29 are at logic "1" levels and the gates of the other 2 transistors in section 29 are at "0" levels. Similarly, the gates of 2 of the transistors in section 30 are at "1" levels and the gates of the other 2 transistors in section 30 are at "0" levels, and the gates of 2 of the transistors in section 31 are at "1" levels and the gates of the other 2 transistors in section 31 are at "0" levels. The levels X+(½) LSB, X+255+(½) LSB, and X+255+(¾) LSB are "redundant", as subsequently explained. (The circuit hardware should be ready or available for all four kinds of bit-level-shifting, and a few redundant signal levels are required to accomplish this. If cells 30 and 31 in FIG. 3-2 are replaced by a single equivalent N-channel transistor, proper circuit operation is achieved for the above-described zero-bit-level shift operation, in which the programmed circuit configuration is as shown in FIG. 3-2, even if the redundant level associated with the switch S(A) is removed. However, proper circuit operation cannot be achieved for the (¼) LSB-level shifting operation shown in FIG. 4.)

Figure 4:
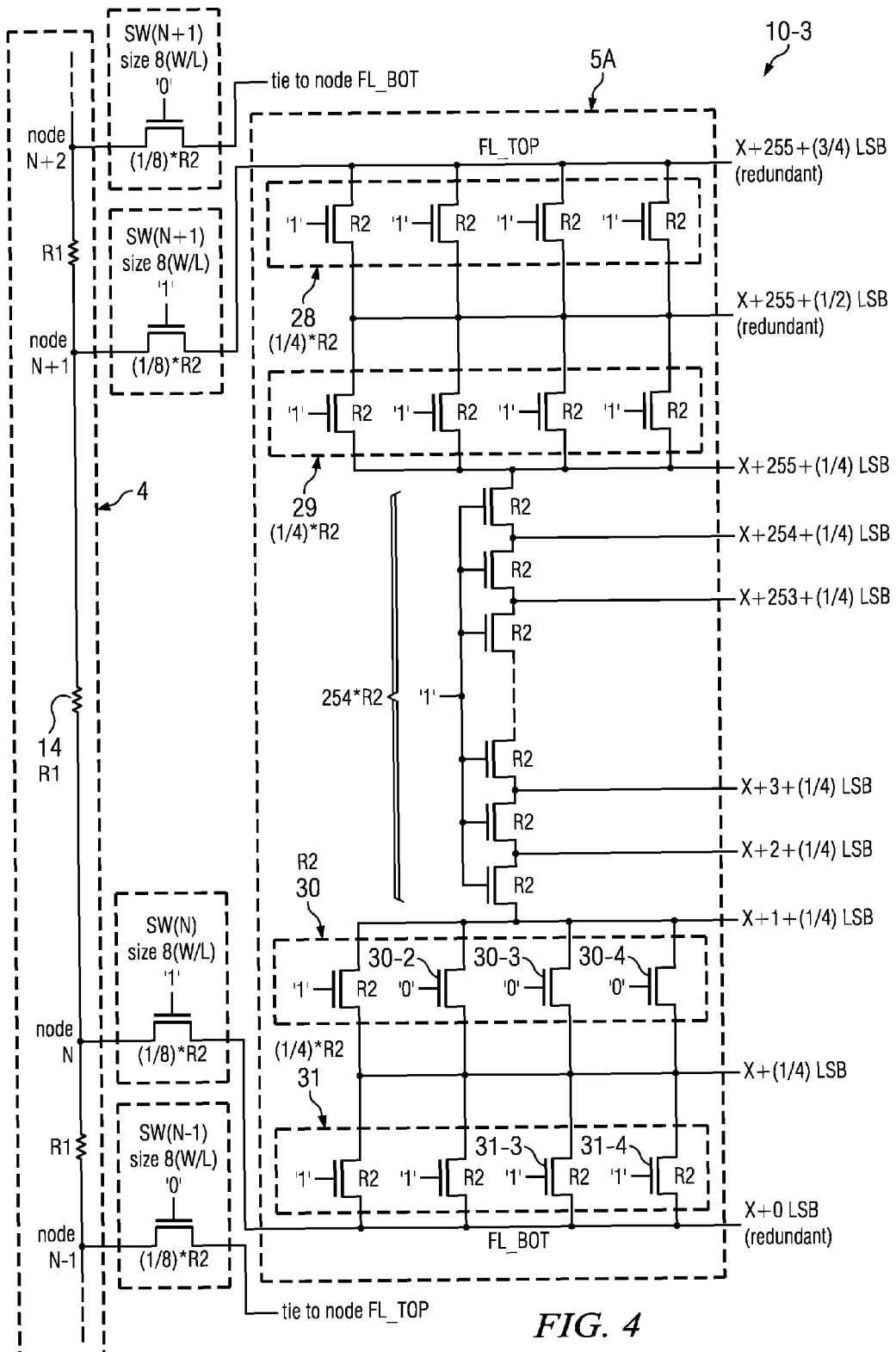
FIGS. 4-7, wherein FIG. 7 consists of FIGS. 7-1 and 7-2, are diagrams of the dual-resistor ladder DAC of FIG. 3 illustrating various LSB signal shift operations.

Note that an 8-bit fine ladder is illustrated, so it has 256 levels which can be decoded to generate the DAC output on conductor 3. In FIG. 3-2, any one of 256 levels of integer "I" LSBs, where I=0, 1, . . . , 255, can be chosen by 8-to-256 decoder 8. The three extra levels X+(½) LSB, X+255+(½) LSB and X+255+(¾) LSB do not belong to the integer "I" LSB category. They are produced by 8-to-256 decoder 8 in a 0-level shift operation as indicated in FIG. 3-2, but the levels X+(½) LSB and X+255+(½) LSB are selected by bit-shifting decoder 15A to generate the DAC output on conductor 3 in the (½) LSB level shifting case shown in FIG. 5, wherein X+255+(¾) LSB are decoded to generate the DAC output on conductor 3 in the (¾) LSB level shift case indicated in FIG. 6. Therefore, these three levels may be considered to be "redundant" with respect to FIG. 3, but they are decoded in other different bit-level shift cases. The basic reason for providing the foregoing bit-level shift signal redundancy is that the same circuitry needs to be ready for various four-level shifting operation cases. For example, to perform a (¼) LSB level shift as shown in FIG. 4, four nMOS transistors are connected in parallel in each of cells 28, 29, and 31. But this inevitably generates a redundant level X+½ LSB in the 0 LSB level shifting case indicated in FIG. 3-2. (If the redundancy is removed, then the ¼ LSB level shifting operation as indicated in FIG. 4 can not be implemented.)

The described 2 bit signal level shift scheme in FIG. 3-2 illustrates "0 shifting" operation in fine ladder 5A and its switches, in which levels of the integer number I LSB (where I is any integer from 0 to 255) are generated. For the example shown in FIG. 3-2, no actual level shifting occurs in the level shifting resistor groups or cells 28, 29, 30, and 31. All N-channel transistors in FIG. 3 have a size of W/L except the ones with different W/L ratios indicated. In the example of FIG. 3, all of the transistors have a logic "1" or a logic "0" gate voltage level indicated to show whether that transistor is turned on or off.

In contrast with DAC 10-2 of Prior Art FIG. 2A, all of the poly resistors R2 in fine ladder 5 of FIG. 2A have been replaced in FIG. 3 with "nMOS resistors" to overcome the drawbacks of Prior Art FIG. 2A addressed previously. (Recall that an "nMOS resistor" is a N-channel transistor operating in its triode region to form an equivalent resistor.) On one hand, the N-channel transistors coupled between coarse ladder 4 and fine ladder 5A (e.g., the transistor switches SW(N−1), SW(N), SW(N+1), SW(N+2), etc.) may be turned on or off so as to shunt the resistance of fine ladder 5A with a selected coarse ladder resistance R1 based on the digital input decoding and the four parallel-connected N-channel MOS R2 resistors in the top two resistor cells 28 and 29. The bottom two resistor cells 30 and 31 in fine ladder 5A may be turned on or off to perform the signal level shift operation. One the other hand, when a N-channel transistor having a size W/L is turned on, its channel resistance $R_{DS(ON)}$ acts as a "standard unit resistance" R2 in fine ladder 5A, and provides good matching with all other nMOS resistors in resistor cells 28, 29, 30, and 31 in fine ladder 5A.

Thus, all the components within fine ladder 5A, and also the transistor switches SW(0), SW(1), . . . , SW(N), SW(N+1), . . . , SW(64) connected between coarse ladder 4 and fine ladder 5A performing fine ladder switching, and also the resistor cells 28, 29, 30, and 31 involved in bit signal level shifting, are N-channel transistors of the same nominal size W/L or 8*(W/L). Therefore, all of the components within fine ladder 5A and all of the switches SW(0), SW(1), . . . , SW(N), SW(N+1), . . . , SW(64) experience the same process control during wafer fabrication, and they all have same temperature coefficient.

This greatly improves the preciseness of matching between every component in fine ladder 5A and the transistor switches SW(0), SW(1) . . . SW(N+1), SW(N+2) . . . SW(64) connected between coarse ladder 4 and fine ladder 5A, and greatly improves the differential nonlinearity DNL and integral nonlinearity INL performance of dual resistor DAC 10-3 over both process variations and temperature variations, compared to dual resistor DAC 10-2 of Prior Art FIGS. 2 and 2A.

Also in contrast with DAC 10-2 of Prior Art FIG. 2A, the top two resistor cells 28 and 29 and the bottom two resistor cells 30 and 31 of fine ladder 5A in FIG. 3 each have 4 nMOS resistors connected in parallel. These N-channel MOS resistors may be independently turned on or off by logic control that includes 2-shifting-bit decoder 15A, depending on the amount of signal shifting required in accordance with the output 19 of 2-shifting-bit decoder 15A. The gates of the series-connected 254 nMOS "R2 resistors" in the mid-portion of fine ladder 5A all are connected to $V_{DD}$, which keeps these nMOS resistors all turned on.

FIG. 4 shows a differently decoded configuration of the same example of dual resistor DAC 10-3 in FIG. 3. In this example, the gates of all 4 parallel-connected nMOS R2 resistors in cell 28 are at a logic "1" level and therefore are turned on. Similarly, the gates of all 4 parallel-connected n MOS R2 resistors in cell 29 are at a "1" level, and therefore are turned on. (Note that for convenience, the drawings in FIGS. 4-7 are simplified compared to FIG. 3.)

The "redundant" levels the configuration of shown in fine ladder 5A of FIG. 4 are different than in the configuration of fine ladder 5A shown in FIG. 3-2. In cell 30 of FIG. 4, the gate of one of parallel-connected nMOS R2 resistors is at a "1" level and therefore is turned on, and the gates of the other 3 nMOS resistors are at a "0" level and therefore they are turned off. And in cell 31, the gates of all 4 parallel-connected nMOS R2 resistors are at a logic "1" level, and therefore they are turned on. In FIG. 4, the levels X+0 LSB, X+255+(½) LSB, and X+255+(¾) LSB are redundant. FIG. 4 illustrates ¼ LSB shift operation in which levels of (I+(¼) LSB are generated, where I=0 to 255). Similarly, the top two resistor cells 28 and 29 and bottom two resistor cells 30 and 31 are programmed so that I+(¼) LSB levels become available. The voltage potential in fine ladder 5A in the configuration of FIG. 4 is up-shifted (¼) LSB compared to the configuration of fine ladder 5A in FIG. 3-2.

Figure 5:
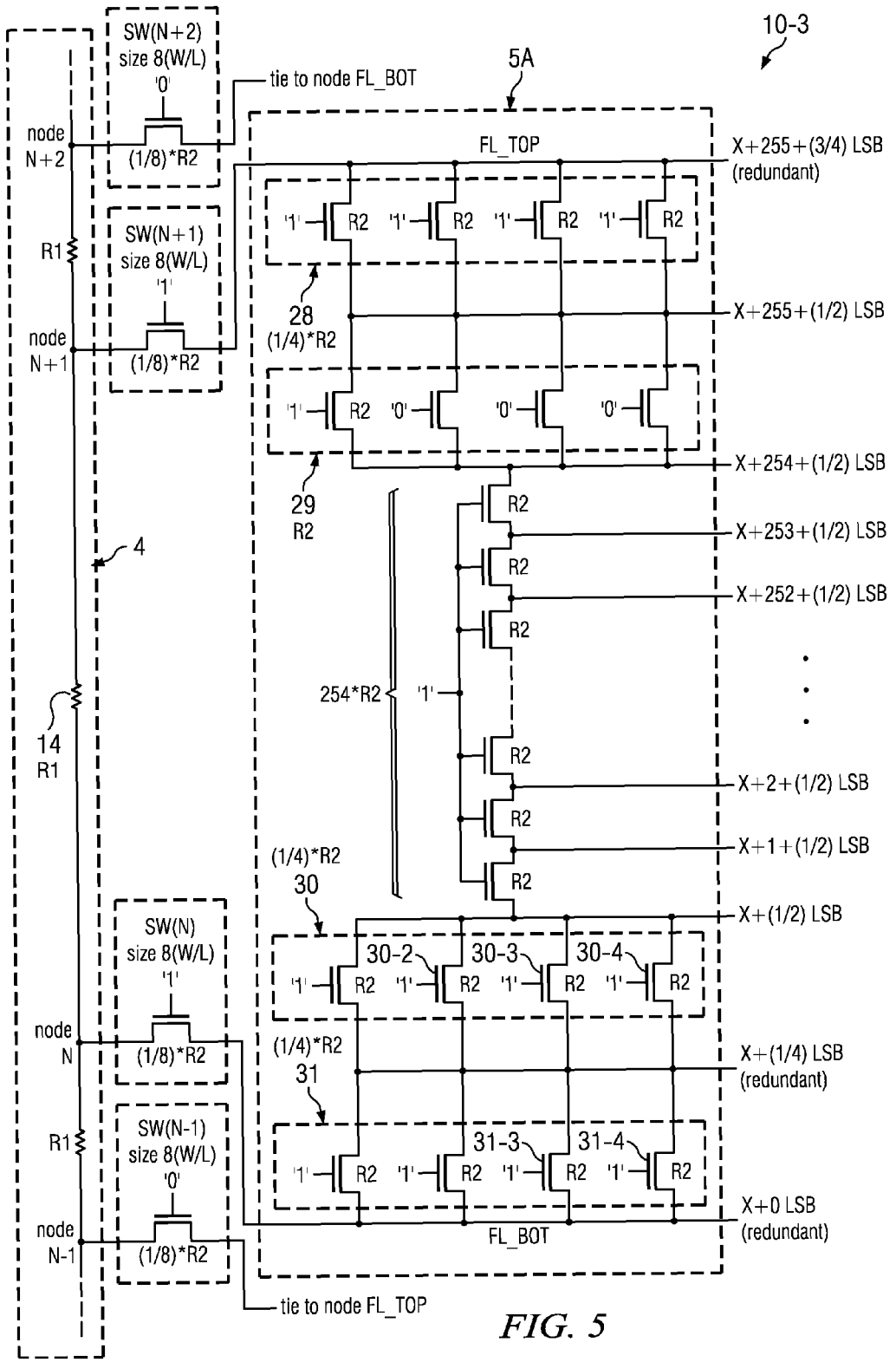

FIG. 5 shows yet another decoding configuration of the same dual resistor DAC 10-3 wherein different levels in fine ladder 5A are redundant. In cell 28, the gates of all 4 parallel-connected nMOS R2 resistors are at a logic "1" level, and therefore are turned on. The equivalent resistance of cell 28 is (¼)*R2. Similarly, in cell 29, the gate of one of parallel-connected nMOS R2 resistors is at a logic "1" level and therefore is turned on, and the gates of the other three nMOS resistors in cell 28 are at a logic "0" level and therefore are turned off. The equivalent resistance of cell 29 is R2. In cells 30 and 31 the gates of all 4 parallel-connected nMOS R2 resistors are at a logic "1" level, and therefore are turned on. Both of cells 30 and 31 have an equivalent resistance of (¼)*R2. FIG. 5 therefore illustrates ½ LSB shift operation in which the top two cell 28 and 29 and the bottom cell 30 and 31 are programmed by the decoding in such a way that voltage levels of (I+(½)) LSB, where I=0 to 255, are generated in the fine ladder and fed to DAC output 3 in a way similar to the way shown in FIG. 3-2. The levels X+0 LSB, X+(¼) LSB, and X+255+(¾) LSB are redundant in the example of FIG. 5 because they can be respectively produced in 0 LSB level shifting as in FIG. 3-2, (¼) LSB level shifting as in FIG. 4, and (¾) LSB shifting as in FIG. 5.

Figure 6:
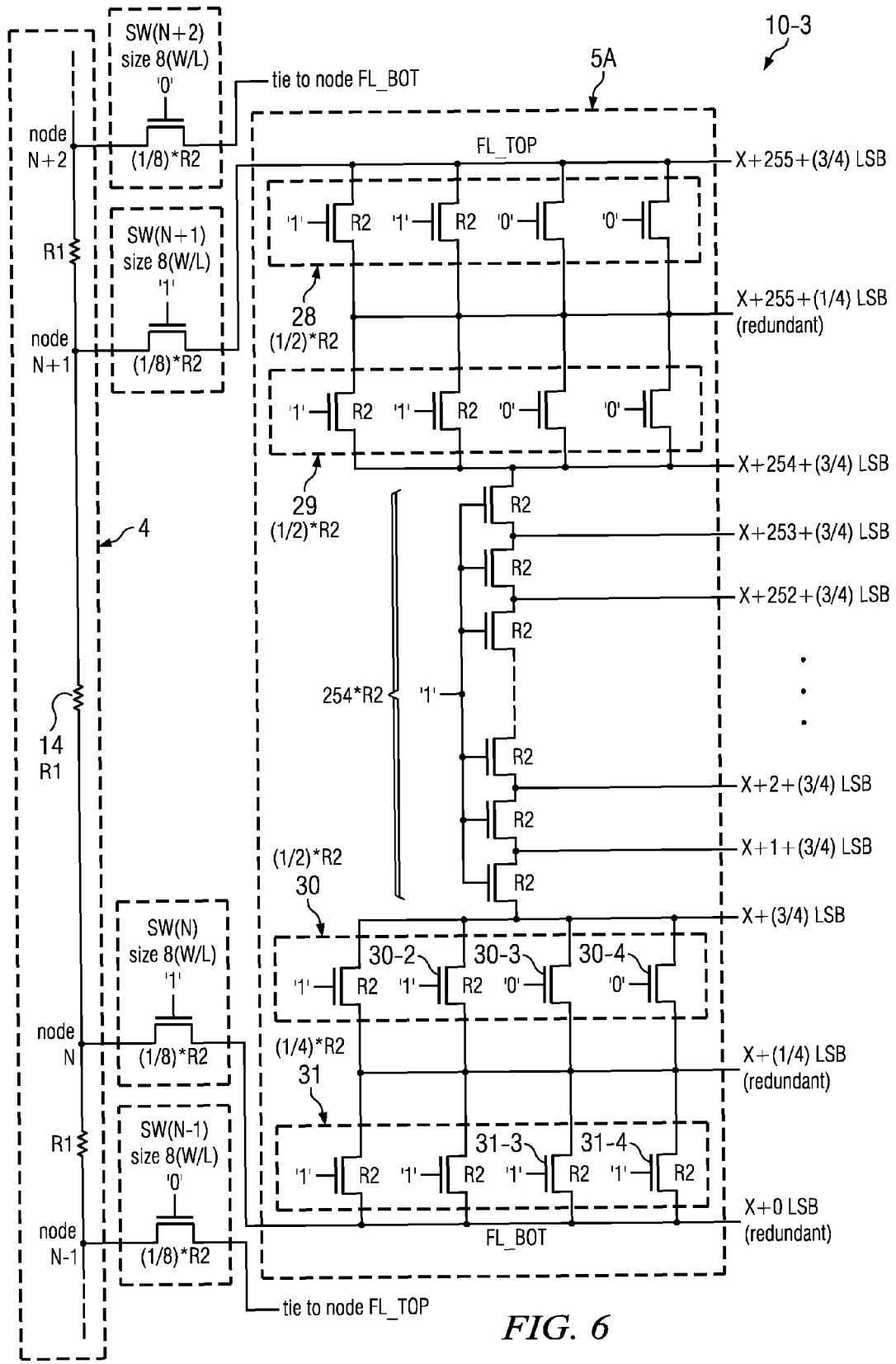

FIG. 6 shows yet another decoding configuration of the same dual resistor DAC 10-3 shown in FIGS. 3-1 and 3-2, except that even different levels in fine ladder 5A are redundant. In cell 28, the gates of all 4 parallel-connected nMOS R2 resistors are at a "1" level and therefore are turned on. Similarly, in cell 29, the gate of one of parallel-connected nMOS R2 resistors is at a "1" level and therefore it is turned on, and the gates of the other 3 nMOS resistors are at a "0" level and therefore they are turned off. In cell 30 the gates of all 4 parallel-connected nMOS R2 resistors are at a "1" level, and therefore are turned on. In cell 28, the gates of all 4 parallel-connected nMOS R2 resistors are at a "1" level and therefore they are turned on. And in cell 31, the gates of all 4 parallel-connected nMOS R2 resistors are at a "1" level, and therefore they are turned on. The levels X+0 LSB, X+(¼) LSB, and X+255+(¾) LSB are redundant. FIG. 6 therefore illustrates ¾ LSB shift operation in which levels of (I+(¾)) LSB are generated, where I=0 to 255. The top two resistor cells 28 and 29 and bottom two resistor cells 30 and 31 are programmed so that I+(¼) LSB levels become available.

Table 1 shows a summary of the 2-bit signal level shift operations depicted in FIGS. 3-6.

It is important to note that for all signal shift cases, the total resistance of fine ladder 5A is maintained to be (255+¾)×R2, and it is important to keep the voltage scale on a unit resistance constant for all four of the level shifting cases described above with reference to FIGS. 3-6. Considering all of the four cases illustrated in FIGS. 3-6, a total of 1024 discrete analog levels are generated and may be selected in response to the fine ladder decoding by 8 LSB decoder 8 and bit-shifting decoder 15A and then selectively passed to DAC output conductor 3. This provides the performance of an equivalent 16 bit DAC, by extending the resolution of a 14 bit dual resistor ladder DAC by 2 bits.

Although the 2-bit level shifting of the present invention is more complex than the prior art 1-bit level shifting, much more precise matching of the MOS resistors in the fine ladder and the MOS switches coupled between the fine ladder and the coarse ladder is achieved and therefore the above-mentioned substantially improved DNL and I and L performance is also achieved.

Figures 1, 7:
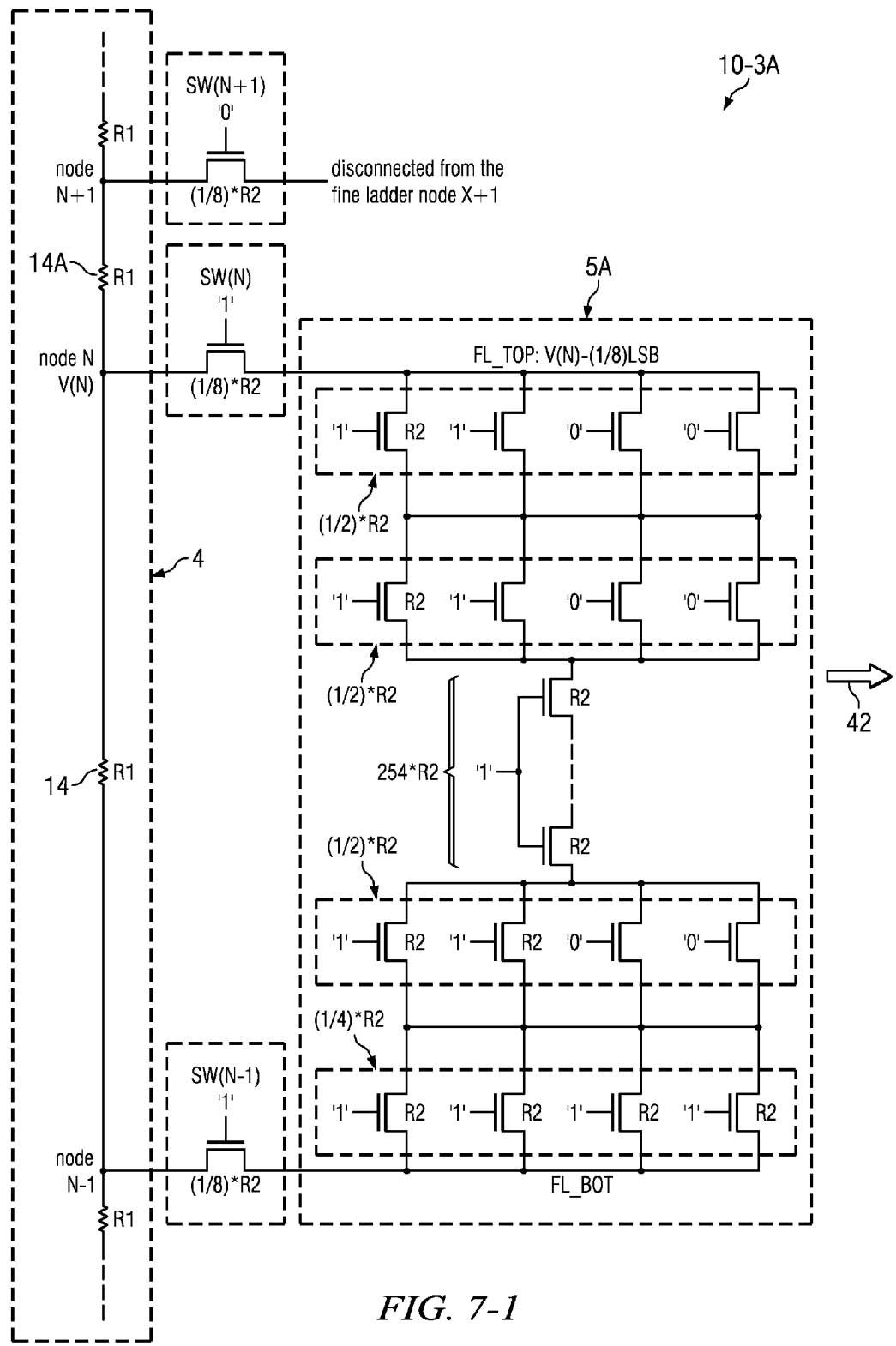
Figures 2, 7:
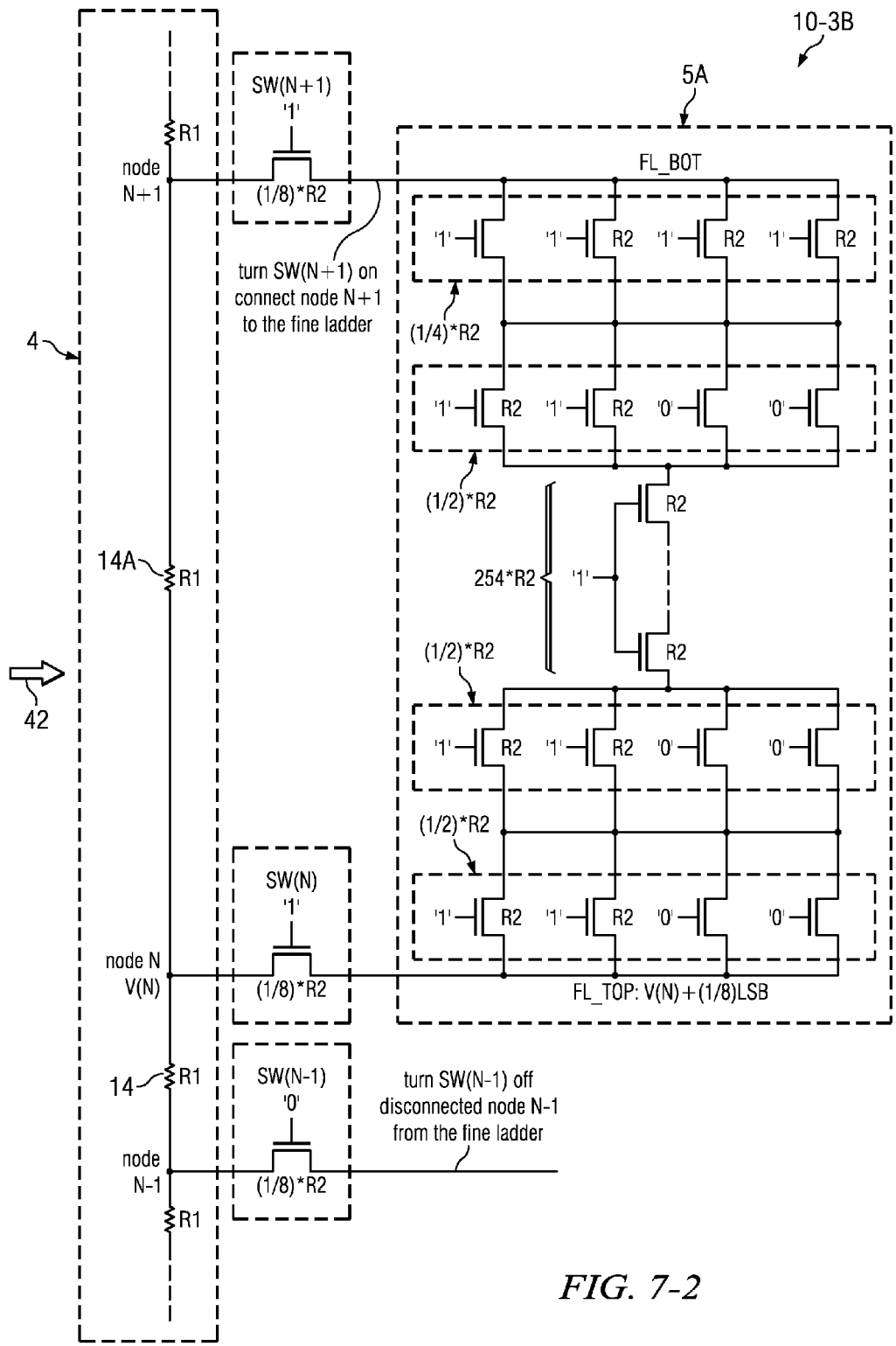

FIG. 7, which consists of FIGS. 7-1 and 7-2, illustrates the 2 bit signal level shifting scheme of FIG. 3-2 for the case in which a transition occurs wherein fine ladder 5A of FIG. 3-2 is disconnected from coarse ladder resistor 14 between node N−1 and node N and then is reconnected or "flipped", as indicated by arrow 42, so as to be shunted with the next coarse ladder resistor 14A between nodes N and N+1. The top node FL_TOP of fine ladder 5A should have a voltage that represents a ⅛ LSB voltage drop below the coarse ladder node to which it is coupled prior to the transition from coarse resistor 14 2 coarse resistor 14A, because the voltage drop across an N-channel transistor switch of size 8(W/L) is a ⅛ LSB voltage drop. After then being switched from coarse resistor 14 so as to be shunted with the next adjacent coarse ladder resistor 14A, node FL_TOP is at a voltage that is a ⅛ LSB voltage drop higher than the voltage of the original course ladder node to which node FL_TOP was previously connected. Therefore, during the transition, node FL_TOP experiences a ¼ LSB voltage jump, which is the "minimum step voltage" of the 2-bit level shifting DAC 10-3 of FIGS. 3-1 and 3-2.

When fine ladder 5A is switched from being shunted with one coarse ladder resistor R1 to another, the absolute resistance of the nMOS resistors may vary somewhat according to Equation (1) because the source electrode voltages Vs of the various series-connected nMOS resistors R2 are slightly different. However, the relative resistance value of every "unit nMOS resistor" with size W/L in fine ladder 5A, compared to the "ON" resistance is of the corresponding switch transistor (i.e., the corresponding one of switch transistors SW(0), SW(1), . . . , SW(64)) and the "ON" resistance of the fine ladder nMOS resistor/switches that are operating to perform

TABLE 1

| Shift Operation | 1st cell from bottom | 2nd cell from bottom | center part | 2nd cell from top | 1st cell from top | Fine Ladder total resistance | Corresponding Figure |
|---|---|---|---|---|---|---|---|
| No shift | ½ R2 | ½ R2 | 254 R2 | ½ R2 | ¼ R2 | 255¾ R2 | FIG. 3 |
| Up shift ¼ LSB | ¼ R2 | R2 | 254 R2 | ¼ R2 | ¼ R2 | 255¾ R2 | FIG. 4 |
| Up shift ½ LSB | ¼ R2 | ¼ R2 | 254 R2 | R2 | ¼ R2 | 255¾ R2 | FIG. 5 |
| Up shift ¾ LSB | ¼ R2 | ½ R2 | 254 R2 | ½ R2 | ½ R2 | 255¾ R2 | FIG. 6 | the level shift operations, are relatively constant irrespective of which coarse ladder resistor R1 is shunted with fine ladder 5A. For example, if the full signal range across coarse ladder 4 is 0.8 volt, the voltage drop applied from one coarse ladder resistor R1 to fine ladder 5A is approximately 12.5 millivolts, which ensures that every fine ladder nMOS resistor operates in its deep triode region and therefore functions as a resistor. If the gate voltage of all of the nMOS resistors in fine ladder 5A is equal to 1.8 volt and the threshold voltage of each is 0.6 volt, then the resistance variation due to the above-mentioned 12.5 millivolt change in the nMOS resistor source electrode voltages Vs between the top resistor cell 28 and the bottom resistor cell 31 in fine ladder 5A is only 3.125%, corresponding to a low DNL error of 0.03125 LSB.

FIGS. 9A-9F show a few examples of how the outputs 19 generated by bit-shifting decoder 15A are decoded to selectively turn the MOS resistors in sections 28, 29, 30, and 31 in FIGS. 3-6 on and off, and also to show how they are utilized to turn output-switching transistors S(0), S(1), . . . , S(255) and output-switching transistors S(A), S(B), and S(C) on and off. Such decoding generates the bid-shifted levels X+(½) LSB, X+255+(½) LSB, and X+255+(¾) LSB in FIGS. 3-6.

Figure 9A:
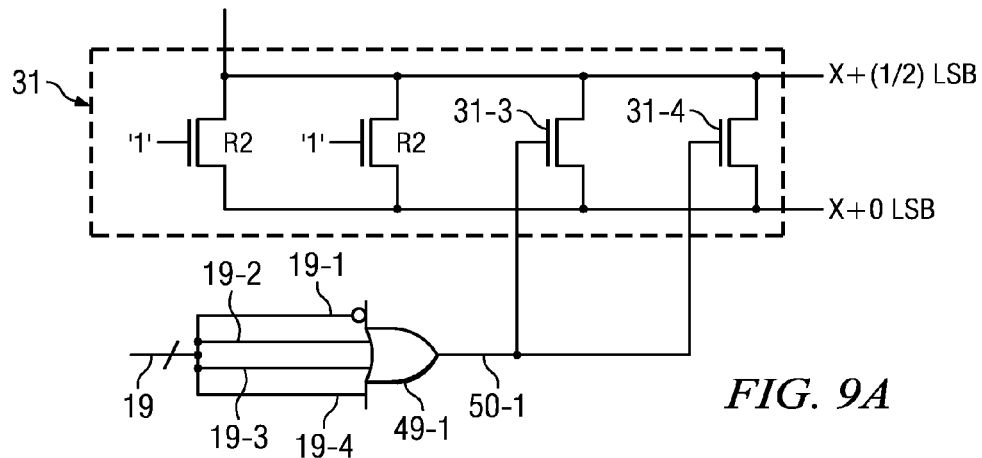
FIGS. 9A-9F are logic diagrams of decoding circuits that may be associated with bit-shifting decoder 15A in FIG. 3.

In FIG. 9A, the four conductors 19-1, 19-2, 19-3, and 19-4 of bus 19 driven by bit-shifting decoder 15A are decoded by means of a combinational NOR gate 49-1 having a first input connected to the logical complement of the signal on conductor 19-1. The second, third, and fourth inputs of combinational NOR gate 49-1 are connected to conductors 19-2, 19-3, and 19-4, respectively. The output conductor 50-1 of gate 49-1 is connected to the gates of transistors 31-3 and 31-4 in cell 31 in fine ladder 5A. The logic levels 00, 01, 10, and 11 of DIN<1:0> cause the following:

(1) the "00" levels cause the configuration of FIG. 9A to generate a "0" on the gates of transistors 31-3 and 31-4 as shown in FIG. 3-2, (2) the "01" levels cause the configuration of FIG. 9A to generate a "1" on the gates of transistors 31-3 and 31-4 as shown in FIG. 4

(3) the "10" levels cause the configuration of FIG. 9A to generate a "1" on the gates of transistors 31-3 and 31-4 as shown in FIG. 5, and (4) the "11" levels cause the configuration of FIG. 9A to generate a "1" on the gates of transistors 31-3 and 31-4 as shown in FIG. 6.

Figure 9B:
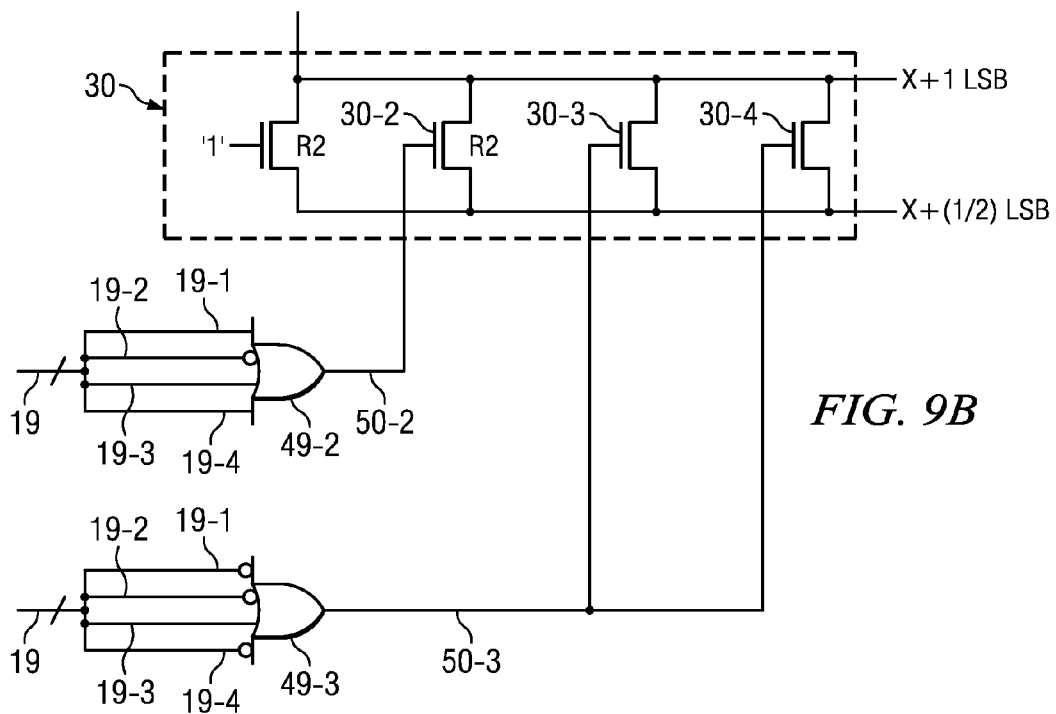

Similarly, in FIG. 9B, the four conductors 19-1, 19-2, 19-3, and 19-4 of bus 19 are decoded by means of a combinational NOR gate 49-2 in FIG. 9B having a first input connected to conductor 19-1, a second input connected to the logical complement of the signal on conductor 19-2, and third and fourth inputs connected to conductors 19-3, and 19-4, respectively. The output conductor 50-2 of gate 49-2 is connected to the gate of transistor 30-2 in cell 30 in fine ladder 5A. Also, conductors 19-1, 19-2, 19-3, and 19-4 are decoded by means of another combinational NOR gate 49-3 having a first input connected to the logical complement to the signal on conductor 19-1, a second input connected to the logical complement of the signal on conductor 19-2, a third input connected to conductor 19-3, and a fourth input connected to the logical complement of the signal on conductor 19-4. The output conductor 50-3 of gate 49-3 is connected to the gates of transistors 30-3 and 30-4 in cell 30. The logic levels 00, 01, 10, and 11 of DIN<1:0> cause the following:

(1) the "00" levels cause the configuration of FIG. 9B to generate a "1" on the gate of transistor 30-2 as shown in FIG. 3-2, (2) the "01" cause the configuration of FIG. 9B to generate a "0" on the gate of transistor 30-2 as shown in FIG. 4, (3) the "10" levels the configuration of FIG. 9B to generate a "1" on the gate of transistor 30-2 as shown in FIG. 5, and (4) the "11" cause the configuration of FIG. 9B to generate a "1" on the gate of transistor 30-2 as shown in FIG. 6.

Since transistor switches 30-3 and 30-4 are only turned on in the configuration of FIG. 5 when DIN<1:0>=10 and the logic level on conductor 19-3 is a "1", transistor switches 30-3 and 30-4 are off in the cases shown in FIGS. 3-2, 4, and 6.

Figure 9C:
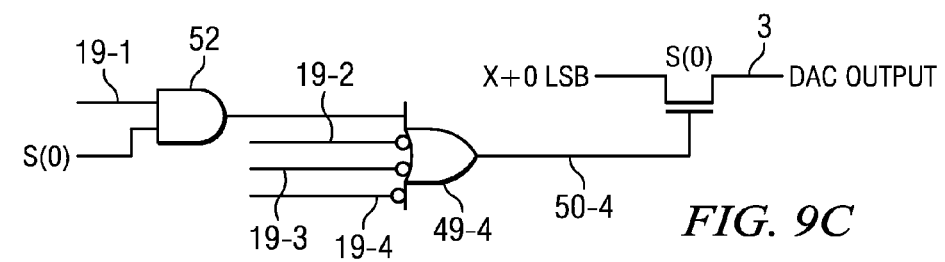

Conductors 19-1, 19-2, 19-3, and 19-4 are decoded by means of another combinational NOR gate 49-4 in FIG. 9C having a first input connected to the output of a 2-input AND gate 52 having one input connected to conductor 19-1 and a second input connected to the gate of S(0). Second, third, and fourth inputs of combinational NOR gate 49-4 are connected to the logical complements of the signal on conductors 19-2, 19-3, and 19-4, respectively. The output conductor 50-4 of gate 49-4 is connected to the gate of fine ladder output transistor S(0). The logic levels 00, 01, 10, and 11 of DIN<1:0> cause the following:

(1) the "00" levels cause the configuration of FIG. 9C to generate a S(0)="1" on the gate of transistor S(0) such that X+0 LSB is the decoder output whenever S(0)=1, (2) the "01" levels cause the configuration of FIG. 9C to generate a "0" on the gate of transistor S(0), i.e., cause transistor switch S(0) to be redundant, (3) the "10" levels cause the configuration of FIG. 9C to generate a "0" on the gate of transistor S(0), i.e., cause transistor switch S(0) to be redundant, and (4) the "11" levels the configuration of FIG. 9C to generate a "0" on the gate of transistor S(0), i.e., cause transistor switch S(0) to be redundant.

Figure 9D:
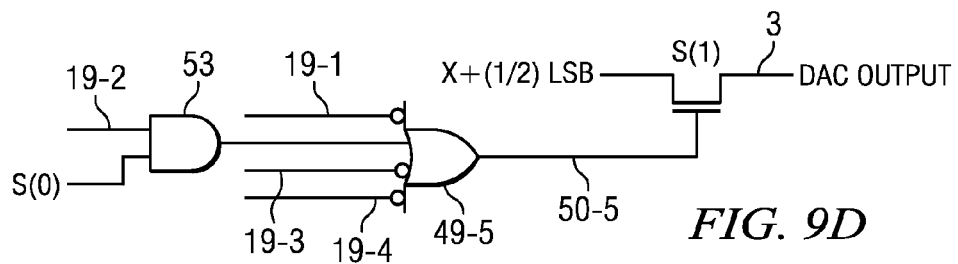

Conductors 19-1, 19-2, 19-3, and 19-4 also are decoded by means of another combinational NOR gate 49-5 in FIG. 9D having a second input connected to the output of a 2-input AND gate 3 having one input connected to conductor 19-2 and a second input connected to the gate of S(0). First, third, and fourth inputs of combinational NOR gate 49-5 are connected to the logical complements of the signals on conductors 19-1, 19-3, and 19-4, respectively. The output conductor 50-5 of gate 49-5 is connected to the gate of fine ladder output transistor S(A). The logic levels 00, 01, 10, and 11 of DIN<1:0> cause the following:

(1) the "00" levels cause the configuration of FIG. 9D to generate a "0" on the gate of transistor S(A), i.e., cause transistor switch S(A) to be redundant, (2) the "01" levels cause the configuration of FIG. 9D to generate a "1" on the gate of transistor S(A) such that X-(½) LSB is the decoder output whenever S(0)=1, (3) the "10 levels cause the configuration of FIG. 9D to generate a "0" on the gate of transistor S(A), i.e., cause transistor switch S(A) to be redundant, and (4) the "11" levels cause the configuration of FIG. 9D to generate a "0" on the gate of transistor S(A), i.e., cause transistor switch S(A) to be redundant.

Figure 9E:
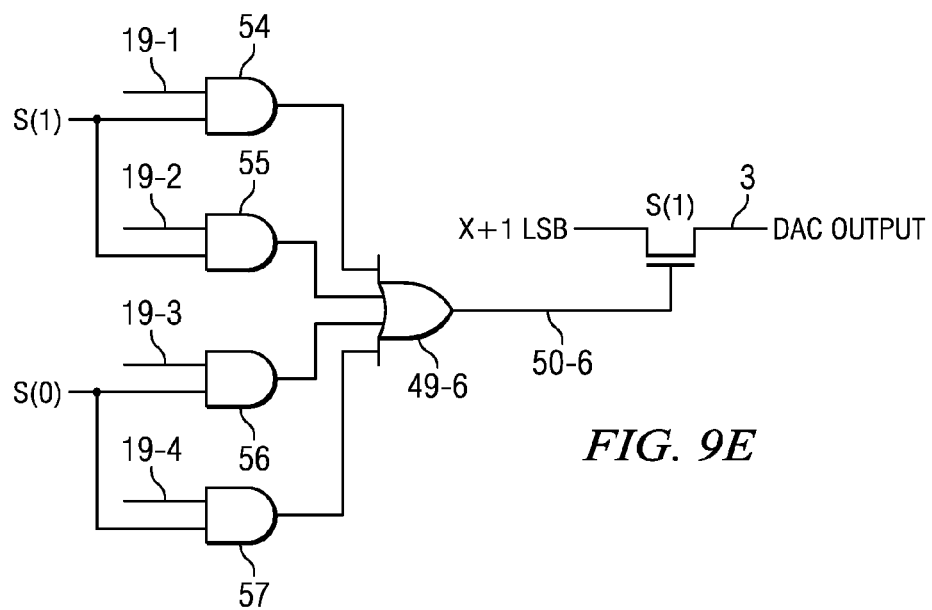

Conductors 19-1, 19-2, 19-3, and 19-4 also are decoded by means of another combinational NOR gate 49-6 in FIG. 9E having first, second, third, and fourth inputs connected to the outputs of 2-input AND gates 54, 55, 56, and 57, respectively. First inputs of AND gates 54, 55, 56, and 57 are connected to conductors 19-1, 19-2, 19-3, and 19-4, respectively. Second inputs of gates 54 and 55 are connected to the gate of S(1). Second inputs of gates 56 and 57 are connected to the gate of S(0). The output conductor 50-6 of gate 49-6 is connected to the gate of fine ladder output transistor S(1).

The logic levels 00, 01, 10, and 11 of DIN<1:0> cause the following:

(1) the "00" levels cause the configuration of FIG. 9E to be decoded by S(1) as indicated in FIG. 3-2 so as to generate a "1" on the gate of transistor S(1) such that DAC OUTPUT=X+1,
(2) the "01" levels cause the configuration of FIG. 9E to be decoded by S(1) so as to generate a "1" on the gate of transistor S(1) such that DAC OUTPUT=X+1+(¼),
(3) the "10" levels cause the configuration of FIG. 9E to be decoded by S(0) so as to generate a "1" on the gate of transistor S(1) such that DAC OUTPUT=X+1+(½), and
(4) the "11" levels causes configuration of FIG. 9E to be decoded by S(0) so as to generate a "1" on the gate of transistor S(1) such that DAC OUTPUT=X+1+(¾).

Figure 9F:
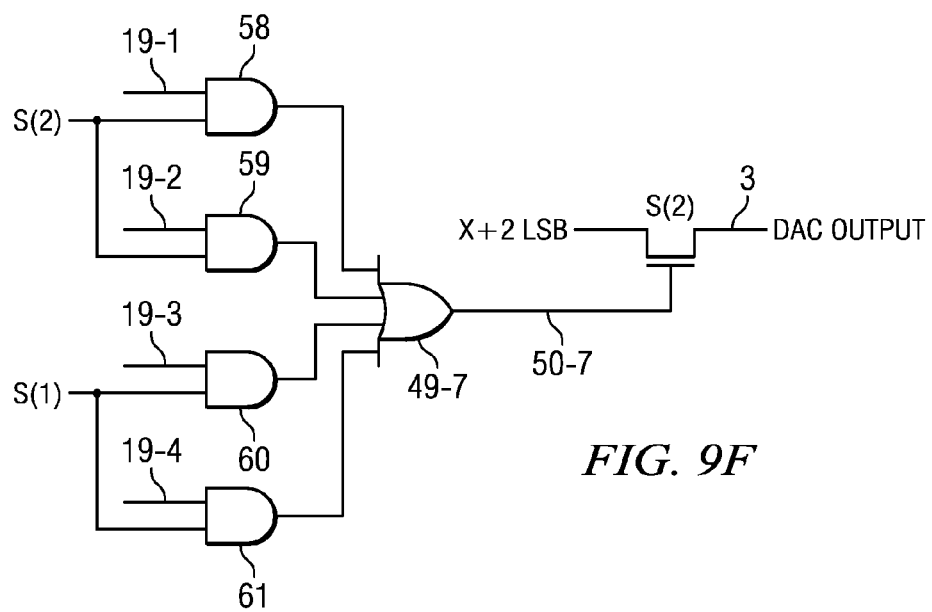

Conductors 19-1, 19-2, 19-3, and 19-4 also are decoded by means of another combinational NOR gate 49-7 in FIG. 9F having first, second, third, and fourth inputs connected to the outputs of 2-input AND gates 58, 59, 60, and 61, respectively. First inputs of AND gates 58, 59, 60, and 61 are connected to conductors 19-1, 19-2, 19-3, and 19-4, respectively. Second inputs of gates 58 and 59 are connected to the gate of S(2). Second inputs of gates 60 and 61 are connected to the gate of S(1). The output conductor 50-7 of gate 49-7 is connected to the gate of fine ladder output transistor S(2). The logic levels 00, 01, 10, and 11 of DIN<1:0> cause the following:
(1) the "00" levels cause the configuration of FIG. 9F to be decoded by S(2) as indicated in FIG. 3-2 so as to generate a "1" on the gate of transistor S(1) such that DAC OUTPUT=X+2,
(2) the "01" levels cause the configuration of FIG. 9F to be decoded by S(2) so as to generate a "1" on the gate of transistor S(1) such that DAC OUTPUT=X+2+(¼),
(3) the "10" levels cause the configuration of FIG. 9F to be decoded by S(1) so as to generate a "1" on the gate of transistor S(1) such that DAC OUTPUT=X+2+(½), and
(4) the "11" levels cause the configuration of FIG. 9F to be decoded by S(1) so as to generate a "1" on the gate of transistor S(1) such that DAC OUTPUT=X+2+(¾).

FIG. 8 shows a 3 bit signal level shifting circuit in a fine ladder 5B of a dual resistor ladder DAC 10-4, the architecture of which is similar to that of dual resistor ladder DAC 10-2 of FIGS. 3-7 but wherein 3 bits, rather than 2 bits, of bit level shifting are performed to extend the resolution of a 14 bit dual resistor ladder DAC from 14 bits to 17 bits. Only N-channel transistor switches SW(N) and SW(N+1) switches are shown. For convenience, none of the fine ladder output transistor switches S(0), S(1) . . . S(255) or S(A), S(B), and S(C) in FIG. 3-2 are shown in FIG. 8. The transistor switches SW(0), SW(1) . . . SW(64) all have a size of 16×(W/L) in the 3-bit level shifting scheme of FIG. 8, in contrast to the 2-bit level shifting scheme of FIG. 3 in which the transistor switches SW(0), SW(1), . . . , SW(64) all have a size of 8×(W/L); and the other MOS transistor switches and MOS resistor/switches have a size of W/L.

The top 3 resistor cells 28, 36, and 29 and the bottom 3 resistor cells 30, 39, and 31 of fine ladder 5D in FIG. 8 may be programmed to have a resistance R2, (½)R2, (¼)R2 or (⅛) R2, depending on which bit signal level shifting operation needs to be performed. If all 8 nMOS transistors/resistors in any one of cells 28, 36, 29, 30, 39, and 31 are turned on, the resulting effective resistance of that cell is (⅛)R2. The mid-portion of fine ladder 5B includes of 253 nMOS "R2 resistors" operating in their deep triode regions. The fine ladder 5B total resistance is kept at (255+⅞)×R2 for all signal bit level shifting operations. The top 3 resistor cells 28, 36, and 29 and the bottom 3 resistor cells 30, 39, and 31 of fine ladder 5B each have 8 parallel-connected nMOS resistors/switches (of size W/L). These nMOS resistors/switches in FIG. 8 are controlled by a suitable decoding analogous to bit-shifting decoder logic 15A in FIG. 3-2 to perform the level shifting operations in a way similar to those in FIG. 3-2. The ON transistor switch resistance of switches SW(0), SW(0) . . . SW(64) coupled between coarse ladder 4 and fine ladder 5B should be (1/16)×R2. The total resistance of fine ladder 5B should be kept equal to (255+⅞)×R2. This provides an equivalent 17 bit DAC by providing 3-bit signal level shifting based on a dual resistor ladder 14 bit DAC. The 3-bit signal level shifting operations are summarized in Table 2.

TABLE 2

| Shift operation | 1st cell from bottom | 2nd cell from bottom | 3rd cell from bottom | center part | 3rd cell from top | 2nd cell from top | 1st cell from top | Fine ladder total resistance |
| --- | --- | --- | --- | --- | --- | --- | --- | --- |
| No shift | ½ R2 | ½ R2 | R2 | 253 R2 | ½ R2 | ¼ R2 | ⅛ R2 | 255⅞ R2 |
| Up shift ⅛ LSB | ⅛ R2 | R2 | R2 | 253 R2 | ¼ R2 | ¼ R2 | ¼ R2 | 255⅞ R2 |
| Up shift ⅛ LSB | ¼ R2 | R2 | R2 | 253 R2 | ¼ R2 | ¼ R2 | ⅛ R2 | 255⅞ R2 |
| Up shift ⅜ LSB | ⅛ R2 | ⅛ R2 | ⅛ R2 | 253 R2 | R2 | R2 | ½ R2 | 255⅞ R2 |
| Up shift ½ LSB | ¼ R2 | ¼ R2 | R2 | 253 R2 | R2 | ¼ R2 | ⅛ R2 | 255⅞ R2 |
| Up shift ⅝ LSB | ¼ R2 | ¼ R2 | ⅛ R2 | 253 R2 | R2 | R2 | ¼ R2 | 255⅞ R2 |
| Up shift ¾ LSB | ¼ R2 | ¼ R2 | ¼ R2 | 253 R2 | R2 | R2 | ⅛ R2 | 255⅞ R2 |
| Up shift ⅞ LSB | ½ R2 | ¼ R2 | ⅛ R2 | 253 R2 | R2 | ½ R2 | ½ R2 | 255⅞ R2 |

The use of the described multi-bit signal level shifting in the fine ladder of a dual resistor ladder DAC enhances the resolution of the DAC without increasing ladder impedance and capacitance and without sacrificing circuit speed performance. Use of nMOS resistors operating deep in their triode regions instead of polycrystalline silicon fine ladder poly resistors in the fine ladder results in precise matching level of the fine ladder components over process and temperature variation because all of the components in the fine ladder and the transistor switches performing the fine ladder signal bit level switching are all the same device type. This greatly improves DNL and INL performance of the dual resistor ladder DAC, and is accomplished without degrading DAC speed performance.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the switching transistors can be P-channel MOS transistor or CMOS transmission gates.

What is claimed is:

1. A digital-to-analog converter (DAC) comprising:
   (a) a coarse ladder including a first linear sequence of series-connected coarse ladder resistive devices, and a plurality of coarse ladder nodes coupled between various series-connected coarse ladder resistive devices, respectively;
   (b) a fine ladder including
      a second linear sequence of series-connected MOS (metal oxide semiconductor) fine ladder transistors coupled between a first conductor and a second conductor and biased to operate in their deep triode regions,
      a first group of parallel-connected MOS programmable bit-shifting transistors each coupled between the first conductor and a third conductor, and a second group of parallel-connected MOS programmable bit-shifting transistors each coupled between the third conductor and a top conductor, and
      a third group of parallel-connected MOS programmable bit-shifting transistors each coupled between a bottom conductor and a fourth conductor, and a fourth group of parallel-connected MOS programmable bit-shifting transistors each coupled between the second conductor and the fourth conductor, the programmable bit-shifting transistors being programmable to be either turned either on or off, respectively, in response to a plurality of bit-switching bits of a binary number to be converted; and
   (c) bit-shifting resistor switching circuitry including a plurality of bit-shifting switching transistors configured to couple a predetermined one of the bottom conductor, the fourth conductor, the third conductor and the top conductor to a DAC output conductor in response to the plurality of bit-switching bits to provide increased resolution of the DAC.

2. The digital-to-analog converter of claim 1 including coarse ladder switching circuitry including a plurality of coarse ladder switching transistors configured to selectively couple the top conductor to one terminal of a selected coarse ladder resistive device and to selectively couple the bottom conductor another terminal of the selected coarse ladder resistive device in response to a plurality of MSB (most significant bit) bits of the binary number, and also including fine ladder switching circuitry including a plurality of fine ladder switching transistors configured to selectively couple a predetermined node of the second linear sequence of series-connected MOS fine ladder transistors to the DAC output conductor in response to a plurality of LSB (least significant bit) bits of the binary number.

3. The digital-to-analog converter of claim 1 wherein the binary number to be converted includes 6 MSBs (most significant bits), 8 LSBs (least significant bits), and at least 2 least significant bit-shifting bits.

4. The digital-to-analog converter of claim 2 wherein the fine ladder transistors, the programmable bit-shifting transistors of the first, second, third, and fourth groups, the coarse ladder switching transistors, the fine ladder switching transistors, and the bit-shifting switching transistors are N-channel transistors.

5. The digital-to-analog converter of claim 4 wherein the fine ladder transistors, the programmable bit-shifting transistors of the first, second, third, and fourth groups, the fine ladder switching transistors, and the bit-shifting switching transistors each have a channel-width-to-channel-length ratio equal to W/L, and the coarse ladder switching transistors each have a channel-width-to-channel-length ratio equal to a predetermined multiple of W/L so as to achieve an on-state resistance of each switch that is equal to half of the resistance of a minimum unit resistance in the fine ladder.

6. The digital-to-analog converter of claim 5 wherein the coarse ladder switching transistors each have a channel-width-to-channel-length ratio equal to $2^{K+1} \times (W/L)$, wherein K is a constant.

7. The digital-to-analog converter of claim 1 wherein the first, second, third, and fourth groups each include four of the parallel-connected MOS programmable bit-shifting transistors.

8. The digital-to-analog converter of claim 1 wherein the first, second, third, and fourth groups each include eight of the parallel-connected MOS programmable bit-shifting transistors.

9. The digital-to-analog converter of claim 2 including an MSB decoder for decoding the plurality of MSB bits of the binary number to be converted to control the plurality of coarse ladder switching transistors, a LSB decoder for decoding the plurality of LSB bits of the binary number to be converted to control the plurality of fine ladder switching transistors, and a bit-shifting decoder for decoding the plurality of bit-shifting bits of the binary number to be converted to control the plurality of bit-switching transistors.

10. The digital-to-analog converter of claim 9 wherein the bit-shifting decoder includes first circuitry for decoding the bit-shifting bits to control gates of at least one of the bit-switching transistors.

11. The digital-to-analog converter of claim 10 wherein the bit-shifting decoder includes second circuitry for decoding the bit-shifting bits to control gates of the programmable bit-shifting transistors of the first, second, third, and fourth groups.

12. The digital-to-analog converter of claim 1 wherein drains of odd-numbered coarse ladder switching transistors SW(0), SW(1) . . . SW(N−1), SW(N), SW(N+1), SW(N+2) . . . SW(63), SW(64) are coupled to the bottom conductor and drains of even coarse ladder switching transistors are coupled to the top conductor.

13. The digital-to-analog converter of claim 1 wherein the binary number to be converted includes 6 MSBs (most significant bits), 8 LSBs (least significant bits), and 3 least significant bit-shifting bits.

14. The digital-to-analog converter of claim 13 including a fifth group of parallel-connected MOS programmable bit-shifting transistors coupled between the third conductor and a fifth conductor, the first group being coupled between the top conductor and the fifth conductor, and also including a sixth group of parallel-connected MOS programmable bit-shifting transistors coupled between the fourth conductor and a sixth conductor, the fourth group being coupled between the second conductor and the sixth conductor, wherein each of the first, second, third, fourth, fifth and sixth groups includes at least eight parallel-connected MOS programmable bit-shifting transistors.

15. A method for increasing the resolution of a dual resistor ladder digital-to-analog converter (DAC) including a coarse ladder including a first linear sequence of series-connected coarse ladder resistive devices and a plurality of coarse ladder nodes connected between various series-connected coarse ladder resistive devices, respectively, and also including a fine ladder including a second linear sequence of series-connected MOS (metal oxide semiconductor) fine ladder transistors coupled between a first conductor and a second conductor, the method comprising:
  (a) coupling a first group of parallel-connected MOS programmable bit-shifting transistors between the first conductor and a third conductor, and coupling a second group of parallel-connected MOS programmable bit-shifting transistors between the third conductor and a top conductor;
  (b) coupling each of a third group of parallel-connected MOS programmable bit-shifting transistors between a bottom conductor and a fourth conductor, and coupling a fourth group of parallel-connected MOS programmable bit-shifting transistors between the second conductor and the fourth conductor;
  (c) turning various parallel-connected MOS programmable bit-shifting transistors either on or off in response to a plurality of bit-switching bits of a binary number to be converted, to provide a plurality of bits of increased resolution; and
  (d) coupling one of the bottom conductor, first conductor, second conductor, third conductor, and top conductor to a DAC output conductor in response to the plurality of bit-switching bits, to produce an analog output signal having accuracy representative of the increased resolution.

16. The method of claim 15 including:
  selectively coupling the top conductor to one terminal of a selected coarse ladder resistive device and selectively coupling the bottom conductor to another terminal of the selected coarse ladder resistive device in response to a plurality of MSB (most significant bit) bits of the binary number to be converted; and
  coupling either a predetermined conductor of the second linear sequence of series-connected MOS fine ladder transistors to the DAC output conductor in response to a plurality of LSB (least significant bit) bits of the binary number to be converted or a predetermined one of the fourth conductor, the third conductor and the top conductor to the DAC output conductor in response to the plurality of bit-switching bits.

17. The method of claim 16 including selectively coupling the top conductor to one terminal of a selected coarse ladder resistive device and selectively coupling the bottom conductor to another terminal of the selected coarse ladder resistive device in response to a plurality of MSB (most significant bit) bits of the binary number, the method also including selectively coupling a predetermined node of the second linear sequence of series-connected MOS fine ladder transistors to the DAC output conductor in response to a plurality of LSB (least significant bit) bits of the binary number.

18. The method of claim 17 including decoding the plurality of MSB bits of the binary number to be converted to control a plurality of coarse ladder switching transistors to selectively couple the selected coarse ladder resistive device to the top conductor and the bottom conductor, decoding the plurality of LSB bits of the binary number to be converted to control a plurality of fine ladder switching transistors to selectively couple a selected fine ladder node to the DAC output conductor and, decoding the plurality of bit-shifting bits of the binary number to be converted to control a plurality of bit-switching transistors to selectively couple the first, second, third, and fourth conductors to the DAC output conductor.

19. The method of claim 18 including decoding the bit-shifting bits to control gates of the bit-switching transistors by means of first decoding circuitry, the method also including decoding the bit-shifting bits to control gates of the programmable bit-shifting transistors of the first, second, third, and fourth groups by means of the second decoding circuitry.

20. A dual resistor ladder digital-to-analog converter (DAC) comprising:
  (a) a coarse ladder including a first linear sequence of series-connected coarse ladder resistive devices and a plurality of coarse ladder nodes connected between various series-connected coarse ladder resistive devices, respectively, and a fine ladder including a second linear sequence of series-connected MOS (metal oxide semiconductor) fine ladder transistors coupled between a first conductor and a second conductor;
  (b) means for coupling a first group of parallel-connected MOS programmable bit-shifting transistors between the first conductor and a third conductor, and coupling a second group of parallel-connected MOS programmable bit-shifting transistors between the third conductor and a top conductor;
  (c) means for coupling each of a third group of parallel-connected MOS programmable bit-shifting transistors between a bottom conductor and a fourth conductor, and coupling a fourth group of parallel-connected MOS programmable bit-shifting transistors between the second conductor and the fourth conductor;
  (d) means for turning various parallel-connected MOS programmable bit-shifting transistors either on or off in response to a plurality of bit-switching bits of a binary number to be converted, to provide a plurality of bits of increased resolution; and
  (e) means for coupling one of the bottom conductor, first conductor, second conductor, third conductor, and top conductor to a DAC output conductor in response to the plurality of bit-switching bits, to produce an analog output signal having accuracy representative of the increased resolution.

* * * * *